(12) United States Patent
Emadi et al.

(10) Patent No.: US 12,165,939 B2
(45) Date of Patent: Dec. 10, 2024

(54) FLUIDIC FLOW CHANNEL OVER ACTIVE SURFACE OF A DIE

(71) Applicant: Illumina, Inc., San Diego, CA (US)

(72) Inventors: Arvin Emadi, San Jose, CA (US); Arnaud Rival, Saint Nazaire les Eymes (FR); Ali Agah, Menlo Park, CA (US); Tara Bozorg-Grayeli, Woodside, CA (US)

(73) Assignee: ILLUMINA, INC., San Diego, CA (US)

( * ) Notice: Subject to any disclaimer, the term of this patent is extended or adjusted under 35 U.S.C. 154(b) by 0 days.

(21) Appl. No.: 18/463,354

(22) Filed: Sep. 8, 2023

(65) Prior Publication Data
US 2023/0420312 A1 Dec. 28, 2023

Related U.S. Application Data

(63) Continuation of application No. 17/820,659, filed on Aug. 18, 2022, now Pat. No. 11,798,854, which is a
(Continued)

(51) Int. Cl.
*H01L 23/00* (2006.01)
*B81B 1/00* (2006.01)
(Continued)

(52) U.S. Cl.
CPC ............ *H01L 23/053* (2013.01); *B81B 1/002* (2013.01); *H01L 23/15* (2013.01);
(Continued)

(58) Field of Classification Search
CPC ... H01L 23/053; H01L 23/15; H01L 23/3185; H01L 23/481; H01L 24/16; H01L 24/48;
(Continued)

(56) References Cited

U.S. PATENT DOCUMENTS

| 7,367,221 B2 | 5/2008 | Hintsche |
| 8,796,746 B2 | 8/2014 | Yang |

(Continued)

FOREIGN PATENT DOCUMENTS

| CN | 109283236 | 1/2019 |
| EP | 1591780 | 11/2005 |

(Continued)

*Primary Examiner* — Elias Ullah
(74) *Attorney, Agent, or Firm* — Illumina, Inc.

(57) ABSTRACT

Provided herein include various examples of an apparatus, a sensor system and examples of a method for manufacturing aspects of an apparatus, a sensor system. The apparatus may include a die. The apparatus may also include a substrate comprising a cavity. The die may be oriented in a portion of the cavity in the substrate, where the orientation defines a first space in the cavity adjacent to a first edge of the upper surface of the die and a second space in the cavity adjacent to the second edge of the upper surface of the die. The apparatus may further include fluidics fan-out regions comprising a first cured material deposited in the first space and the second space, a surface of the fluidics fan-out regions being contiguous with the upper surface of the die.

20 Claims, 22 Drawing Sheets

Related U.S. Application Data continuation of application No. 17/179,783, filed on Feb. 19, 2021, now Pat. No. 11,476,171.

(60) Provisional application No. 62/982,352, filed on Feb. 27, 2020.

(51) Int. Cl.
| | | |
|---|---|---|
| *H01L 23/053* | (2006.01) | |
| *H01L 23/15* | (2006.01) | |
| *H01L 23/31* | (2006.01) | |
| *H01L 23/48* | (2006.01) | |
| *G01N 21/64* | (2006.01) | |

(52) U.S. Cl.
CPC ........ *H01L 23/3185* (2013.01); *H01L 23/481* (2013.01); *H01L 24/16* (2013.01); *H01L 24/48* (2013.01); *H01L 24/73* (2013.01); *G01N 21/6428* (2013.01); *G01N 2021/6439* (2013.01); *H01L 2224/16227* (2013.01); *H01L 2224/2919* (2013.01); *H01L 2224/48227* (2013.01); *H01L 2224/73215* (2013.01)

(58) Field of Classification Search
CPC ........... H01L 24/73; H01L 2224/16227; H01L 2224/2919; H01L 2224/48227; H01L 2224/73215; H01L 2224/0557; H01L 23/13; H01L 23/345; H01L 2224/13025; H01L 2224/32225; H01L 2224/32235; H01L 2224/48105; H01L 2224/73204; H01L 2224/73265; H01L 2224/8592; H01L 2924/15153; H01L 23/3128; H01L 21/4882; H01L 21/76898; H01L 23/473; H01L 24/11; H01L 24/13; H01L 2224/111; H01L 2224/13005; B81B 1/002; G01N 21/6428; G01N 2021/6439; G01N 21/645; B01L 7/00; B01L 2300/0636; B01L 2300/0663; B01L 2300/0877; B01L 2300/1827; B01L 3/502715; B01L 2200/026
See application file for complete search history.

(56) References Cited

U.S. PATENT DOCUMENTS

| | | | |
|---|---|---|---|
| 9,079,179 | B2 | 7/2015 | Wimberger-Friedl et al. |
| 12,011,719 | B2 | 6/2024 | Jamshidi et al. |
| 2004/0043423 | A1* | 3/2004 | Bellew ................ G01N 29/022 |
| | | | 435/7.1 |
| 2014/0353789 | A1 | 12/2014 | Oganesian et al. |
| 2018/0130760 | A1 | 5/2018 | Wang et al. |

FOREIGN PATENT DOCUMENTS

| | | |
|---|---|---|
| JP | 2019505761 | 2/2019 |
| WO | 2015/138648 | 9/2015 |

* cited by examiner

FLUIDIC FLOW CHANNEL OVER ACTIVE SURFACE OF A DIE

CROSS REFERENCE TO RELATED APPLICATIONS

This present application is a continuation of U.S. patent application Ser. No. 17/820,659, filed on Aug. 18, 2022, and entitled, "FLUIDIC FLOW CHANNEL OVER ACTIVE SURFACE OF A DIE," which claims priority from U.S. patent application Ser. No. 17/179,783, filed on Feb. 19, 2021, and entitled, "FLUIDIC FLOW CHANNEL OVER ACTIVE SURFACE OF A DIE," which claims priority from U.S. provisional patent application No. 62/982,352, filed Feb. 27, 2020, entitled, "FLUIDIC FLOW CHANNEL OVER ACTIVE SURFACE OF A DIE," which is hereby incorporated herein by reference in its entirety for all purposes.

BACKGROUND

Various protocols in biological or chemical research involve performing controlled reactions. The designated reactions can then be observed or detected and subsequent analysis can help identify or reveal properties of chemicals involved in the reaction. In some multiplex assays, an unknown analyte having an identifiable label (e.g., fluorescent label) can be exposed to thousands of known probes under controlled conditions. Each known probe can be deposited into a corresponding well of a microplate. Observing any chemical reactions that occur between the known probes and the unknown analyte within the wells can help identify or reveal properties of the analyte. Other examples of such protocols include known DNA sequencing processes, such as sequencing-by-synthesis (SBS) or cyclic-array sequencing.

In some fluorescent-detection protocols, an optical system is used to direct excitation light onto fluorophores, e.g., fluorescently-labeled analytes and to also detect the fluorescent emissions signal light that can emit from the analytes having attached fluorophores. In other proposed detection systems, the controlled reactions in a flow cell are detected by a solid-state light sensor array (e.g., a complementary metal oxide semiconductor (CMOS) detector). These systems do not involve a large optical assembly to detect the fluorescent emissions. The shape of the fluidic flow channel in a flow cell may determine its utility for various uses, for example, SBS or cyclic-array sequencing is enabled in a sensor system utilizing multiple liquid flows, and thus, a fluidic flow channel of specific shape is utilized for SBS or cyclic-array sequencing.

SUMMARY

Accordingly, it may be beneficial for a flow cell fabrication mechanism to enable fabrication and formation of flow cells on an individual level, i.e., utilizing a process where each die may be fabricated individually, rather than the entirety of the wafer being utilized to create multiple flow cells at once, to control the formation of the fluidic flow channel over each individual die.

Thus, shortcomings of the prior art can be overcome and benefits as described later in this disclosure can be achieved through the provision of a method for manufacturing a device for use in a sensor system. Various examples of the method are described below, and the method, including and excluding the additional examples enumerated below, in any combination (provided these combination are not inconsistent), overcome these shortcomings. The method comprises: placing a die in a portion of a cavity in a substrate, wherein one or more electrical contacts are accessible on a surface of the die, wherein the substrate comprises exposed electrical contacts accessible to the electrical contacts on the surface of the die, wherein the placing defines a first space in the cavity adjacent to a first edge of the upper surface of the die and a second space in the cavity adjacent to the second edge of the upper surface of the die; forming an under-fill layer in the cavity between the lower surface of the die and the substrate; forming fluidics fan-out regions by depositing a curable material in the first space and the second space to form the fluidics fan-out regions, a surface of the fluidics fan-out regions being contiguous with the upper surface of the die; and forming a fluidic flow channel over the active surface of the die, comprising: attaching a lid to portions of the substrate adjacent to the fluidics fan-out regions to form the fluidic flow channel between the active surface and the lid.

In some examples, the method also comprises coupling the exposed electrical contacts to the electrical contacts on the surface of the die.

In some examples of the method, the exposed electrical contacts and the electrical contacts on the surface of the die comprise bonding pads, the bonding pads comprising the exposed electrical contacts are each oriented in one of the first space or the second space, and the coupling comprises wire-bonding each exposed electrical contact of the exposed electrical contacts, to one of the electrical contacts on the surface of the die, forming wire-bonded connections.

In some examples, the method also comprises prior to forming the fluidic flow channel, encapsulating the wire-bonded connections by depositing the curable material over the fluidics fan-out regions.

In some examples, forming the fluidic flow channel over the active surface of the die, further comprises: orienting the lid to be in physical contact with a top surface of each of the encapsulated wire-bonded connections, wherein the orienting flattens each top surface.

In some examples of the method, the die further comprises one or more through silicon vias (TSV) extended through a portion of a silicon wafer and a passivation stack, the passivation stack is disposed below a lower surface of the portion of the silicon wafer, a portion of each of the one or more through silicon vias is exposed through an opening of one or more openings in the passivation stack, and each exposed portion is coupled to the electrical contacts.

In some examples, placing further comprises coupling the exposed electrical contacts to the electrical contacts.

In some examples, the method further comprises coupling the exposed electrical contacts to the electrical contacts on the surface of the die.

In some examples, the coupling comprises utilizing a method selected from the group consisting of: reflowing the electrical contacts, wherein the electrical contacts of the die comprise pillar bumps, and utilizing an anisotropic conductive films to couple the electrical contacts to the exposed electrical contacts.

In some examples of the method, the curable material is selected from the group consisting of epoxy and glue.

In some examples of the method, forming fluidics fan-out regions further comprises curing the curable material method further comprises curing the curable material.

In some examples, the curing comprises utilizing a method selected from the group consisting of: exposing the curable material to ultraviolet radiation and exposing the curable material to thermal energy.

In some examples of the method, the die comprises a sensor.

In some examples of the method, the sensor comprises a Complementary Metal-Oxide-Semiconductor (CMOS) detection device.

In some examples of the method, the cavity comprises: a die cavity portion, a fluidics cavity portion, and a top level portion, where the die cavity portion and the under-fill layer, together, are substantially equal in height to the die, where the fluidics cavity portion comprises a space comprising a height of the fluidic flow channel, and where the top level portion comprises a height of the portions of the substrate adjacent to the fluidics fan-out regions.

In some examples, placing the die in the portion of a cavity in a substrate comprises placing the die in the die cavity portion of the substrate.

In some examples of the method, the portions of the substrate adjacent to the fluidics fan-out regions comprise portions of a circuit board, and the top level portion comprises an interface between the circuit board and the lid.

In some examples of the method, the lid comprises an inlet for fluids and an outlet for fluid.

In some examples, attaching the lid comprises applying an adhesive between the circuit board and the lid.

In some examples of the method, the die is singulated from a silicon wafer.

In some examples of the method, the surface of the die is selected from the group consisting of: an upper surface of the die, a portion of the upper surface of the die comprising an active surface, and a lower surface parallel to the upper surface.

Shortcomings of the prior art can be overcome and benefits as described later in this disclosure can be achieved through the provision an apparatus for use in a sensor system. Various examples of the apparatus are described below, and the apparatus, including and excluding the additional examples enumerated below, in any combination (provided these combination are not inconsistent), overcome these shortcomings. The apparatus comprises: a die, wherein one or more electrical contacts are accessible on a surface of the die; a substrate comprising a cavity, wherein the die is oriented in a portion of the cavity in the substrate, wherein the substrate comprises exposed electrical contacts electrically coupled to the electrical contacts on the surface of the die, wherein the orientation defines a first space in the cavity adjacent to a first edge of the upper surface of the die and a second space in the cavity adjacent to the second edge of the upper surface of the die; and fluidics fan-out regions comprising a first cured material deposited in the first space and the second space, a surface of the fluidics fan-out regions being contiguous with the upper surface of the die.

In some examples of the apparatus, the apparatus further comprises a fluidic flow channel over the active surface of the die defined by the surface of the fluidics fan-out regions and the upper surface of the die and a lid attached to portions of the substrate adjacent to the fluidics fan-out regions In some examples of the apparatus, the apparatus further comprises an under-fill layer in the cavity between the lower surface of the die and the substrate.

In some examples of the apparatus, the die is singulated from a silicon wafer.

In some examples of the apparatus, the exposed electrical contacts comprise substrate bonding pads and the electrical contacts on the surface of the die comprise die bonding pads, and wherein each die bonding pad is coupled to at least one substrate bonding pad with a wire, forming wire-bonded connections.

In some examples of the apparatus, the wire-bonded connections are encapsulated in a second cured material.

In some examples of the apparatus, the apparatus also includes a fluidic flow channel over the active surface of the die defined by the surface of the fluidics fan-out regions and the upper surface of the die and a lid attached to portions of the substrate adjacent to the fluidics fan-out regions, and the lid is oriented to be in physical contact with a top surface of each of the encapsulated wire-bonded connections.

In some examples, the die further comprises a silicon wafer, a passivation stack, and one or more through silicon vias extended through a portion of the silicon wafer and the passivation stack, wherein the passivation stack is disposed below a lower surface of the portion of the silicon wafer, wherein a portion of each of the one or more through silicon vias is exposed through an opening of one or more openings in the passivation stack, and wherein each exposed portion is coupled to the electrical contacts.

In some examples, the electrical contacts of the die comprise pillar bumps.

In some examples, each of the cured material and the second cured material are selected from the group consisting of: epoxy and glue.

In some examples, the die comprises a sensor.

In some examples, the sensor comprises a Complementary Metal-Oxide-Semiconductor (CMOS) detection device.

In some examples of the apparatus, the apparatus further comprises an under-fill layer in the cavity between the lower surface of the die and the substrate, and the cavity comprises: a die cavity portion, a fluidics cavity portion, and a top level portion, where the die cavity portion and the under-fill layer, together, are substantially equal in height to the die, where the fluidics cavity portion comprises a space comprising a height of the fluidic flow channel, and where the top level portion comprises a height of the portions of the substrate adjacent to the fluidics fan-out regions.

In some examples, the portion of the cavity in the substrate in which the die is oriented comprises the die cavity portion.

In some examples, the portions of the substrate adjacent to the fluidics fan-out regions comprise portions of a circuit board, and the top level portion comprises an interface between the circuit board and the lid.

In some examples, the lid comprises an inlet for fluids and an outlet for fluid.

In some examples, the fluidic flow channel is approximately 100 um from the active surface to the lid.

In some examples, the circuit board is selected from the group consisting of: a printed circuit board and a ceramic circuit board.

In some examples, the surface is selected from the group consisting of: an upper surface of the die, a portion of the upper surface of the die comprising an active surface, and a lower surface parallel to the upper surface.

Thus, shortcomings of the prior art can be overcome and benefits as described later in this disclosure can be achieved through the provision of a method for manufacturing a device for use in a sensor system. Various examples of the method are described below, and the method, including and excluding the additional examples enumerated below, in any combination (provided these combination are not inconsistent), overcome these shortcomings. The method comprises: picking and placing a die comprising a sensor and one or more electrical contacts accessible on a surface of the die on a cavity surface at a base of a cavity of a carrier, wherein the carrier comprises a substrate and the cavity, wherein the substrate comprises exposed electrical contacts, and wherein the placing defines a first space in the cavity adjacent to a first edge of the surface of the die and a second space in the cavity adjacent to a second edge of the surface of the die; connecting each of the one or more electrical contacts of the die to at least one of the exposed electrical contacts of the substrate; forming fluidics fan-out regions by depositing a curable material in the first space and the second space to form the fluidics fan-out regions; and attaching a lid to portions of the substrate adjacent to the fluidics fan-out regions to form a fluidic flow channel between an active surface of the sensor and the lid.

In some examples of the method, the electrical contacts of the die comprise pillar bumps.

Shortcomings of the prior art can be overcome and benefits as described later in this disclosure can be achieved through the provision an apparatus for use in a sensor system. Various examples of the apparatus are described below, and the apparatus, including and excluding the additional examples enumerated below, in any combination (provided these combination are not inconsistent), overcome these shortcomings. The apparatus comprises: a die; a substrate comprising a cavity, wherein the die is oriented in a portion of the cavity in the substrate, wherein the orientation defines a first space in the cavity adjacent to a first edge of the upper surface of the die and a second space in the cavity adjacent to the second edge of the upper surface of the die; fluidics fan-out regions comprising a first cured material deposited in the first space and the second space, a surface of the fluidics fan-out regions being contiguous with the upper surface of the die; and a fluidic flow channel over the active surface of the die defined by the surface of the fluidics fan-out regions and the upper surface of the die and a lid attached to portions of the substrate adjacent to the fluidics fan-out regions.

Additional features are realized through the techniques described herein. Other examples and aspects are described in detail herein and are considered a part of the claimed aspects. These and other objects, features and advantages of this disclosure will become apparent from the following detailed description of the various aspects of the disclosure taken in conjunction with the accompanying drawings.

It should be appreciated that all combinations of the foregoing aspects and additional concepts discussed in greater detail below (provided such concepts are not mutually inconsistent) are contemplated as being part of the inventive subject matter and to achieve the advantages disclosed herein.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

DETAILED DESCRIPTION

Figure 1:
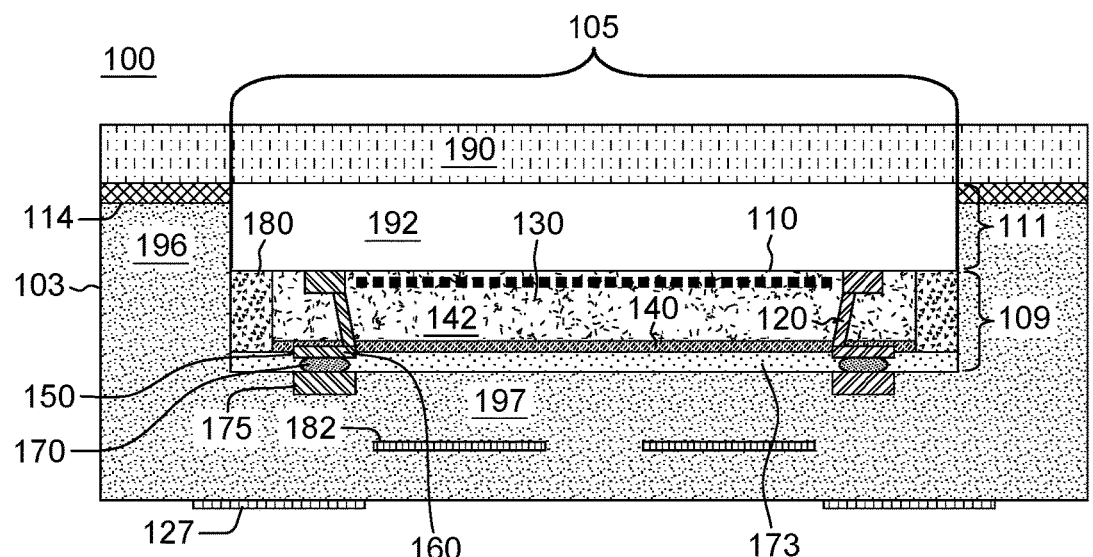
FIG. 1 depicts an example of a flow cell that includes a substrate with a cavity in which a sensor is placed.

The accompanying figures, in which like reference numerals refer to identical or functionally similar elements throughout the separate views and which are incorporated in and form a part of the specification, further illustrate the present implementation and, together with the detailed description of the implementation, serve to explain the principles of the present implementation. As understood by one of skill in the art, the accompanying figures are provided for ease of understanding and illustrate aspects of certain examples of the present implementation. The implementation is not limited to the examples depicted in the figures.

The terms "connect," "connected," "contact" "coupled" and/or the like are broadly defined herein to encompass a variety of divergent arrangements and assembly techniques. These arrangements and techniques include, but are not limited to (1) the direct joining of one component and another component with no intervening components therebetween (i.e., the components are in direct physical contact); and (2) the joining of one component and another component with one or more components therebetween, provided that the one component being "connected to" or "contacting" or "coupled to" the other component is somehow in operative communication (e.g., electrically, fluidly, physically, optically, etc.) with the other component (notwithstanding the presence of one or more additional components therebetween). It is to be understood that some components that are in direct physical contact with one another may or may not be in electrical contact and/or fluid contact with one another. Moreover, two components that are electrically connected, electrically coupled, optically connected, optically coupled, fluidly connected or fluidly coupled may or may not be in direct physical contact, and one or more other components may be positioned therebetween.

The terms "including" and "comprising", as used herein, mean the same thing.

The terms "substantially", "approximately", "about", "relatively", or other such similar terms that may be used throughout this disclosure, including the claims, are used to describe and account for small fluctuations, such as due to variations in processing, from a reference or parameter. Such small fluctuations include a zero fluctuation from the reference or parameter as well. For example, they can refer to less than or equal to ±10%, such as less than or equal to ±5%, such as less than or equal to ±2%, such as less than or equal to ±1%, such as less than or equal to ±0.5%, such as less than or equal to ±0.2%, such as less than or equal to ±0.1%, such as less than or equal to ±0.05%. If used herein, the terms "substantially", "approximately", "about", "relatively," or other such similar terms may also refer to no fluctuations, that is, ±0%.

As used herein, a "flow cell" can include a device having a lid extending over a reaction structure to form a flow channel therebetween that is in communication with a plurality of reaction sites of the reaction structure, and can include a detection device that detects designated reactions that occur at or proximate to the reaction sites. A flow cell may include a solid-state light detection or "imaging" device, such as a Charge-Coupled Device (CCD) or Complementary Metal-Oxide Semiconductor (CMOS) (light) detection device. As one specific example, a flow cell can fluidically and electrically couple to a cartridge (having an integrated pump), which can fluidically and/or electrically couple to a bioassay system. A cartridge and/or bioassay system may deliver a reaction solution to reaction sites of a flow cell according to a predetermined protocol (e.g., sequencing-by-synthesis), and perform a plurality of imaging events. For example, a cartridge and/or bioassay system may direct one or more reaction solutions through the flow channel of the flow cell, and thereby along the reaction sites. At least one of the reaction solutions may include four types of nucleotides having the same or different fluorescent labels. In some examples, the nucleotides bind to the reaction sites of the flow cell, such as to corresponding oligonucleotides at the reaction sites. The cartridge and/or bioassay system in these examples then illuminates the reaction sites using an excitation light source (e.g., solid-state light sources, such as light-emitting diodes (LEDs)). In some examples, the excitation light has a predetermined wavelength or wavelengths, including a range of wavelengths. The fluorescent labels excited by the incident excitation light may provide emission signals (e.g., light of a wavelength or wavelengths that differ from the excitation light and, potentially, each other) that may be detected by the light sensors of the flow cell.

Flow cells described herein perform various biological or chemical processes. More specifically, the flow cells described herein may be used in various processes and systems where it is desired to detect an event, property, quality, or characteristic that is indicative of a designated reaction. For example, flow cells described herein may include or be integrated with light detection devices, sensors, including but not limited to, biosensors, and their components, as well as bioassay systems that operate with sensors, including biosensors.

The flow cells facilitate a plurality of designated reactions that may be detected individually or collectively. The flow cells perform numerous cycles in which the plurality of designated reactions occurs in parallel. For example, the flow cells may be used to sequence a dense array of DNA features through iterative cycles of enzymatic manipulation and light or image detection/acquisition. As such, the flow cells may be in fluidic communication with one or more microfluidic channels that deliver reagents or other reaction components in a reaction solution to a reaction site of the flow cells. The reaction sites may be provided or spaced apart in a predetermined manner, such as in a uniform or repeating pattern. Alternatively, the reaction sites may be randomly distributed. Each of the reaction sites may be associated with one or more light guides and one or more light sensors that detect light from the associated reaction site. In one example, light guides include one or more filters for filtering certain wavelengths of light. The light guides may be, for example, an absorption filter (e.g., an organic absorption filter) such that the filter material absorbs a certain wavelength (or range of wavelengths) and allows at least one predetermined wavelength (or range of wavelengths) to pass therethrough. In some flow cells, the reaction sites may be located in reaction recesses or chambers, which may at least partially compartmentalize the designated reactions therein.

As used herein, a "designated reaction" includes a change in at least one of a chemical, electrical, physical, or optical property (or quality) of a chemical or biological substance of interest, such as an analyte-of-interest. In particular flow cells, a designated reaction is a positive binding event, such as incorporation of a fluorescently labeled biomolecule with an analyte-of-interest, for example. More generally, a designated reaction may be a chemical transformation, chemical change, or chemical interaction. A designated reaction may also be a change in electrical properties. In particular flow cells, a designated reaction includes the incorporation of a fluorescently-labeled molecule with an analyte. The analyte may be an oligonucleotide and the fluorescently-labeled molecule may be a nucleotide. A designated reaction may be detected when an excitation light is directed toward the oligonucleotide having the labeled nucleotide, and the fluorophore emits a detectable fluorescent signal. In another example of flow cells, the detected fluorescence is a result of chemiluminescence or bioluminescence. A designated reaction may also increase fluorescence (or Förster) resonance energy transfer (FRET), for example, by bringing a donor fluorophore in proximity to an acceptor fluorophore, decrease FRET by separating donor and acceptor fluorophores, increase fluorescence by separating a quencher from a fluorophore, or decrease fluorescence by co-locating a quencher and fluorophore.

As used herein, "electrically coupled" and "optically coupled" refers to a transfer of electrical energy and light waves, respectively, between any combination of a power source, an electrode, a conductive portion of a substrate, a droplet, a conductive trace, wire, waveguide, nanostructures, other circuit segment and the like. The terms electrically coupled and optically coupled may be utilized in connection with direct or indirect connections and may pass through various intermediaries, such as a fluid intermediary, an air gap and the like.

As used herein, a "reaction solution," "reaction component" or "reactant" includes any substance that may be used to obtain at least one designated reaction. For example, potential reaction components include reagents, enzymes, samples, other biomolecules, and buffer solutions, for example. The reaction components may be delivered to a reaction site in the flow cells disclosed herein in a solution and/or immobilized at a reaction site. The reaction components may interact directly or indirectly with another substance, such as an analyte-of-interest immobilized at a reaction site of the flow cell.

As used herein, the term "reaction site" is a localized region where at least one designated reaction may occur. A reaction site may include support surfaces of a reaction structure or substrate where a substance may be immobilized thereon. For example, a reaction site may include a surface of a reaction structure (which may be positioned in a channel of a flow cell) that has a reaction component thereon, such as a colony of nucleic acids thereon. In some flow cells, the nucleic acids in the colony have the same sequence, being for example, clonal copies of a single stranded or double stranded template. However, in some flow cells a reaction site may contain only a single nucleic acid molecule, for example, in a single stranded or double stranded form.

The term "fan-out" is used herein to characterize an area that is packaged with a detector that extends a horizontal distance beyond the detector. For example, in examples where a CMOS sensor is utilized as a detector in the flow cell, the fan-out refers to the additional horizontal distance on each side of the horizontal boundaries of the CMOS sensor.

As used herein, the term "pillar bump" is used to describe electrical contacts in examples illustrated and described herein. Wherever the term "pillar bump" is utilized, a variety of examples of electrical contacts can also be utilized in various examples of apparatuses illustrated herein. The electrical contacts, which may be pillar bumps, may comprise an electrically conductive material, such as a metal material (e.g., Cu (copper), Au (gold), W (tungsten), Al (aluminum) or a combination thereof), but it is understood that other electrically conductive materials may be utilized.

Reference is made below to the drawings, which are not drawn to scale for ease of understanding, wherein the same reference numbers are used throughout different figures to designate the same or similar components.

Detection devices and image sensors that can be utilized in flow cells as sensors, such as biosensors, include image sensors or detectors that include a CMOS and a fan-out region. A surface of the CMOS and the fan-out region (on either side) form an active surface. Above the active surface of a CMOS (e.g., silicon wafer 130 in FIG. 1) is a (micro)-fluidic flow channel delineated by a lid of the flow cell 100 on one side, and a contiguous surface including the active surface of a silicon wafer and portions of a fan-out region on either side of this surface of the silicon wafer. In fabricating a flow cell, this fluidic flow channel may formed over a CMOS or other sensor utilizing one or more of a variety of complex molding processes, which involve a fabrication technique consisting of multiple processes, each process of which may or may not introduce inconsistencies. Additionally, various factors in the fabrication and/or construction of the system may affect the utility of the system. For example, the bonding of a lid to a sensor surface can result in improper coverage of the pixel area, hence, reducing the overall pixel number available. Another example of a channel shape that may not be useable for SBS is a channel between a lid and a CMOS which is not designed to enable fluidic flows that are uniform over the sensing area (e.g., the active surface). If a fluidic flow channel is not formed in a useable shape, reagents are not exchanged (e.g., single pot reagents) or cannot be exchanged in a manner that renders reliable results. Thus, it is desirable for any fabrication process for a flow cell to include fewer processes and/or less complex molding processes, but that the resultant flow cell include a fluidic flow channel that may be utilized with a bio-sensor processes including, but not limited to, SBS or cyclic-array sequencing.

To this end, examples discussed herein include methods (and the resultant apparatuses) that introduce a yield enhancement by including, in the formation or fabrication of flow cells, an engineered cavity-based substrates. In examples discussed herein, cavity-based substrates encapsulate molding and a die to form a sensor system.

In some examples, sensor system including a fan-out region and a flow channel are provided, in part, by molding on the cavity-based substrates. In some examples, a fluidic flow channel with material compatibility with sequencing is formed over an individual die (e.g., sensor) without utilizing complex molding processes in existing methods. A material is compatible when the material used to create fluidics paths is chemically and biochemically compatible with the sequencing reagents and enzymes. For example, a material is compatible when the enzyme activity in one of the reagents is not inhibited by contacting the material of the flow channel.

Figure 2:
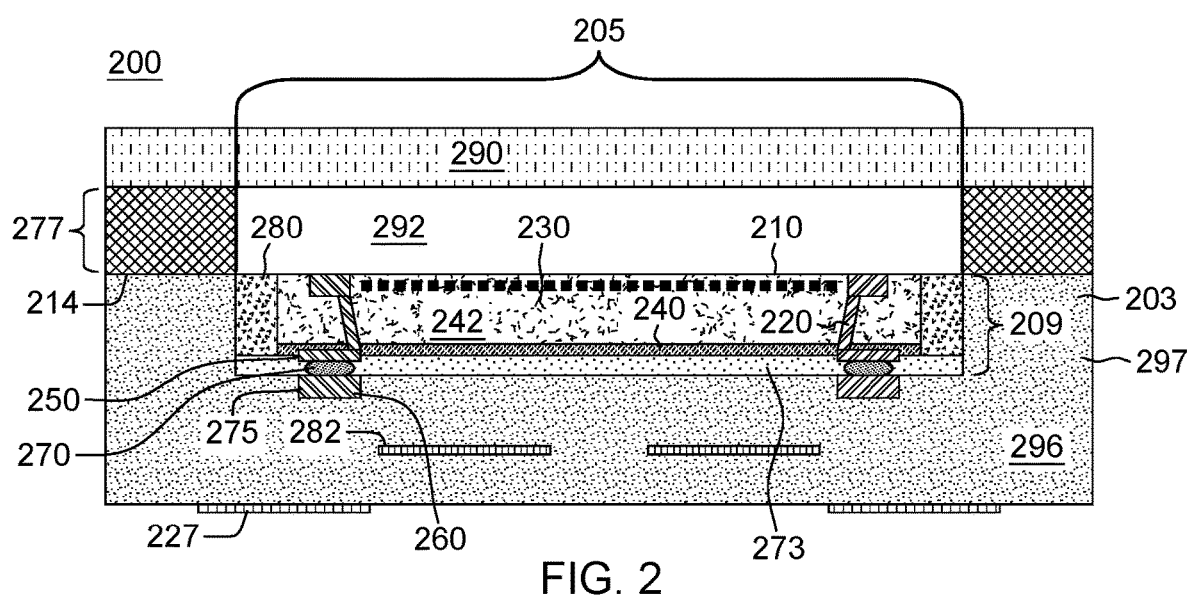
FIG. 2 depicts an example of a flow cell that includes a substrate with a cavity in which a sensor is placed.
Figure 3:
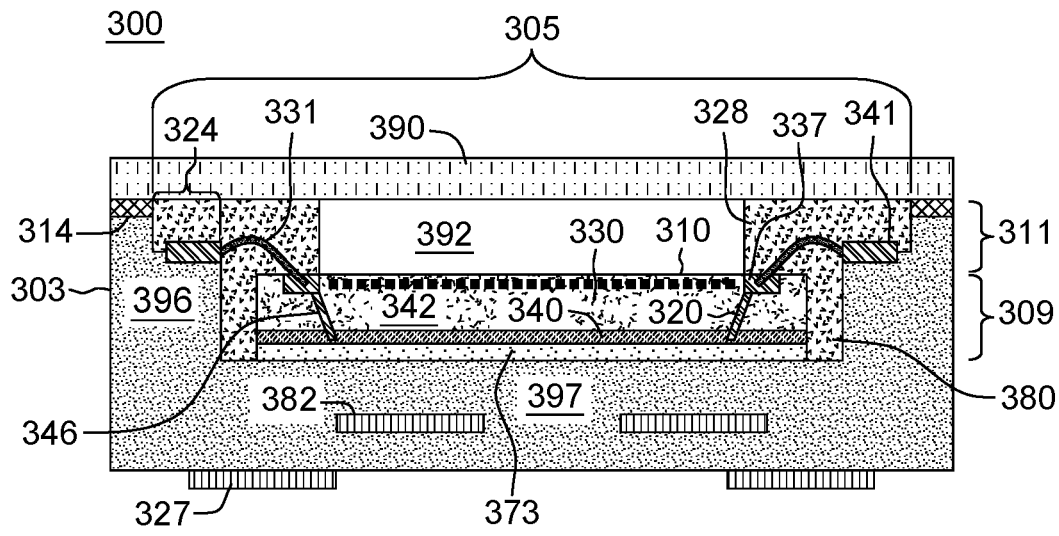
FIG. 3 depicts an example of a flow cell that includes a substrate with a cavity in which a sensor is placed.
Figure 4:
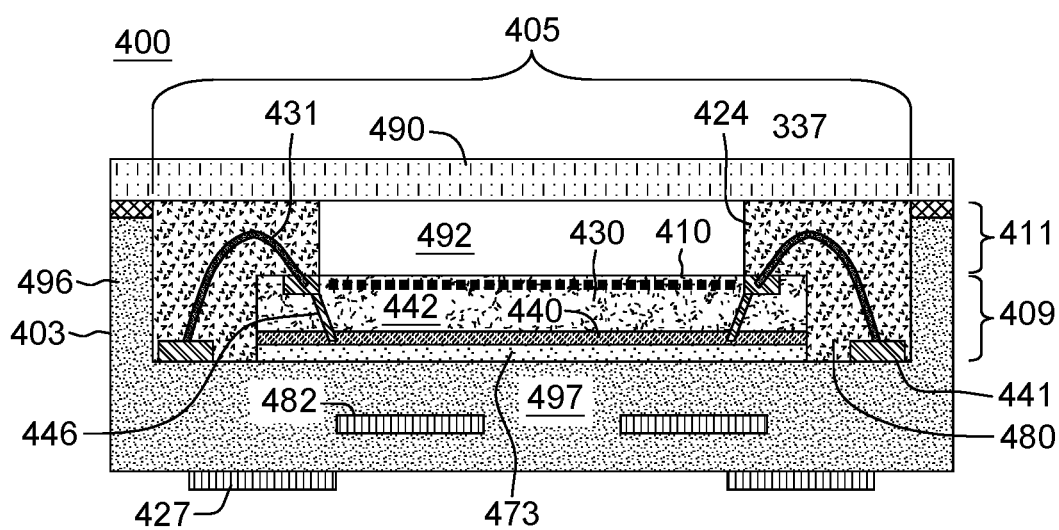
FIG. 4 depicts an example of a flow cell that includes a substrate with a cavity in which a sensor is placed.

FIGS. 1-4 illustrate examples of sensor systems that can be formed utilizing examples of methods discussed herein. Various processes of forming these sensor systems are discussed, but FIGS. 1-4 are provided to illustrate some examples of a resulting apparatus. FIGS. 1-4 are all cross-sectional views of examples of sensor systems. Both FIGS. 1-2 depict examples of flow cells with one or more TSV 120 through the silicon wafer 130 to enable thermal transfer from the silicon wafer 130 (e.g., CMOS). FIGS. 3-4 depict examples of sensor systems formed as a result of examples of methods disclosed herein where a TSV is not utilized for thermal transfer.

FIG. 1 provides an example of a flow cell 100 (also referred to herein as a "sensor system"), formed utilizing certain of the methods described herein. In FIG. 1, portions of the flow cell 100 are formed by joining a sensor structure 142 with a carrier 196 comprising a substrate 197. The carrier includes at least one cavity 105, the bottom of the cavity includes the substrate 197, and it is in the cavity 105 that the sensor structure 142 is placed. The cavity 105 can be understood as including different portions, which will be discussed herein, including a sensor structure cavity portion 109 (which can also be understood as a die cavity portion) and, in some examples, a fluidics flow channel portion 111 (which can also be understood as a fluidics cavity portion).

The placement of the sensor structure 142 in the cavity 105, is discussed in various examples herein.

As illustrated in the example of FIG. 1, the sensor structure 142 portion of the flow cell 100 includes an active (light sensitive) surface 110 of a silicon wafer die 130 (e.g., a CMOS), utilized for light sensing activities (e.g., DNA sequencing). A chemical coating (not pictured) may have previously been applied to this active surface 110. Above the active surface 110 of a silicon wafer die 130, including the chemical coating (not pictured), is a (micro)-fluidic flow channel 192, delineated by a lid 190 of the flow cell 100 on one side, and a contiguous surface including the active surface 110 of a silicon wafer die 130 and portions of a fan-out region 180 on either side of this surface of the silicon wafer die 130. As depicted in this example, a lid 190 is attached to the carrier 196. Lidding the carrier 196, as opposed to the active surface 110 and/or fan-out regions 180 adjacent to the active surface 110, can avoid area loss when utilizing the flow cell in its sensor system utility.

In this example, the (micro)-fluidic flow channel 192 is further defined by a portion of the carrier 196. In this example, a vertical height of the carrier 196 walls 103 adjacent to the cavity 105 that houses the sensor structure 142, exceeds a vertical height of the sensor structure 142, when placed in the cavity 105. For examples, the lid 190 (e.g., a glass or otherwise translucent lid) may or may not be attached to the carrier walls 103 by applying an adhesive to the lid 190 and the carrier 196, at an upper surface of each wall 103. When the silicon wafer die 130 is utilized as a digital image sensor, the active surface 110 of the digital image sensor includes photo-sites or pixels for sensing light. In these examples, non-limiting examples of the function(s) of the sensor include, for example, light sensing (e.g., having a predetermined range of wavelengths sensed), detecting the presence of one or more substances (e.g., biological or chemical substance) and detecting a change in concentration of something (e.g., ion concentration).

In the example illustrated in FIG. 1, the sensor structure 142 also includes one or more TSV 120 through the silicon wafer die 130 to at least of passivation layer 140 on one or more backside metallization layer layers, which are metallization layers that are RDLs, in some examples. In some examples, the passivation layer 140 is a polyamide layer that is deposited and cured at higher temperatures (e.g., about 100C-180C). Connections to the TSV 120, and, therefore, the silicon wafer die 130 are facilitated by opening regions 150 in the passivation layer 140. For ease of understanding, the passivation layer 140 is depicted as a separate layer in FIG. 1. However, this passivation layer 140 is part of the silicon wafer die 130 (as well as the sensor structure 142), and is not pictured as a separate layer in all the figures herein, despite its presence, in order to portray the silicon wafer die 130 (as well as the sensor structure 142) in a more simplistic manner. These opening regions are utilized to make electrical connections to the passivation layer 140, to form pads 160. Electrical contacts, which are often referred to as pillar bumps 170 or pillar bumps, are formed on the pads 160. The pillar bumps 170 can comprise any suitable material, including an electrically conductive material. For example, the pillar bumps 170 may comprise an electrically conductive material, such as a metal material (e.g., Cu (copper), Au (gold), W (tungsten), Al (aluminum) or a combination thereof), but it is understood that other electrically conductive materials may be utilized. In one implementation, the metal (e.g., Cu (copper), Au (gold), W (tungsten), Al (aluminum) or a combination thereof), may be elemental, an alloy, or a metal-containing composite. It is noted that while the term "copper pillar bumps" is used, copper is used only as a presentative material for pillar bumps, and the pillar bumps need not consist of, or comprise, copper. Connectivity to the pillar bumps 170 is provided through an under-fill layer 173, to electrical connections 175 embedded in the substrate 197 portion of the carrier 196. The sensor structure 142, in this example, also includes a fan-out region 180, which, as described in examples herein, can be formed from materials, including but not limited to glue and/or epoxy, which may be cured by methods, including but not limited to, ultraviolet exposure and/or thermal exposure.

The substrate 197 of the example in FIG. 1 may include at least one RDL or other passivation layer 182 (e.g., polyamide). Openings are formed in the RDL or other passivation layer 182 to provide access to the pillar bumps 170 (for electrical connectivity). In this example, on the substrate 197, another passivation layer 182 (e.g., polyamide, epoxy, solder mask, etc.) deposited on the RDL or other passivation layer 182 protects the RDL or other passivation layer 182, increases reliability, and reduces, and in some instances even prevents, electrical shorts. Openings in the other passivation layer enable electrical connection to the RDL or other passivation layer 182, the passivation layer 182 under the under-fill 173, via the electrical contacts 175.

FIG. 2 is an example of a flow cell with one or more TSVs 220, but the carrier 296 comprising a substrate 297 differs from the example illustrated in FIG. 1 because the walls 203 of the carrier 296 are the same height as the sensor structure 242, when the sensor structure 242 is placed in the cavity 205 of the carrier 296, with the under-fill layer between the carrier 296 and the sensor structure 242. Thus, the cavity 205 in the carrier 296 of FIG. 2 does not provide both the substrate 297 and horizontal limits for the (micro)-fluidic flow channel 292. This cavity 205 includes a sensor structure cavity portion 209 (which can also be understood as a die cavity portion), but not a fluidics flow channel portion. As depicted in FIG. 2, in this example, the (micro)-fluidic flow channel 292 is formed in part by a high structure 277, which is a structure added above the top surface of the walls 203 of the carrier 296 in this example. The formation of the (micro)-fluidic flow channel 292 using the high structure 277 is explained in more detail herein.

As depicted in FIG. 1, in FIG. 2, a flow cell 200 is formed, in part, by combining a sensor structure 242 with a carrier 296 comprising a substrate 297. The flow cell 200 includes an active (light sensitive) surface 210 of a silicon wafer die 230 (e.g., a CMOS), utilized for light sensing activities (e.g., DNA sequencing). A chemical coating (not pictured) may have previously been applied to this active surface 210. Above the active surface 210 of the silicon wafer die 230 is the aforementioned (micro)-fluidic flow channel 292, delineated by a lid 290 (e.g., a glass or otherwise translucent lid) of the flow cell 200 on one side, and a contiguous surface including the active surface 210 of a silicon wafer die 230 and portions of a fan-out region 280 on either side of this surface of the silicon wafer die 230. As depicted in this example, the lid 290 is attached to a high structure 277, which is a structure that extends the vertical height of the walls 203 of the carrier 292 to exceed the vertical height of sensor structure 242, when situated in the cavity 205. A space (over the active surface 210 of a silicon wafer die 230 and portions of a fan-out region 280 on either side of this surface of the silicon wafer die 230 to the lid 290) that is a height differential between a height of the sensor structure 242 and the high structure 277, forms the (micro)-fluidic flow channel 292. The lid 290 is attached to top surfaces of the high structure 277. In this example as well as in FIG. 1, lidding the high structure 277, as opposed to the active surface 210 and/or fan-out regions 280 adjacent to the active surface 210, can avoid area loss when utilizing the flow cell in its sensor system utility.

In the example illustrated in FIG. 2, the sensor structure 242 includes one or more TSV 220 through the silicon wafer die 230 to at least of passivation layer 240 on one or more backside metallization layer layers, which are metallization layers that are RDLs, in some examples. As in FIG. 1, connections to the TSV 220, and, therefore, the silicon wafer die 230 are facilitated by opening regions 250 in the passivation layer 240. For ease of understanding, the passivation layer 240 is depicted as a separate layer in FIG. 2. However, this passivation layer 240 is part of the silicon wafer die 230 (as well as the sensor structure 242), and is not pictured as a separate layer in all the figures herein, despite its presence, in order to portray the silicon wafer die 230 (as well as the sensor structure 242) in a more simplistic manner. These opening regions are utilized to make electrical connections to the passivation layer 240, to form pads 260. Electrical contacts, which are often referred to as pillar bumps 270 or pillar bumps, are formed on the pads 260. Connectivity to the pillar bumps 270 is provided through an under-fill layer 273, to electrical connections 275 embedded in the substrate 297. The sensor structure 242, in this example, also includes a fan-out region 280, which, as described in examples herein, can be formed from materials, including but not limited to glue and/or epoxy, which may be cured by methods, including but not limited to, ultraviolet exposure and/or thermal exposure.

The substrate 297 of the example in FIG. 2 may also include at least one RDL or other passivation layer 282 (e.g., polyamide). Openings are formed in the RDL or other passivation layer 282 to provide access to the pillar bumps 270 (for electrical connectivity). In this example, on the substrate 297, another passivation layer 284 (e.g., polyamide, epoxy, solder mask, etc.) deposited on the RDL or other passivation layer 182 protects the RDL or other passivation layer 282, increases reliability, and reduces, and in some instances even prevents, electrical shorts. Openings 286 in the other passivation layer 282 enable electrical connection to the RDL or other passivation layer 282, the passivation layer 282 under the under-fill 273, via the electrical contacts 275.

FIGS. 3-4, likes FIGS. 1-2, as aforementioned, are flow cells formed using examples of the methods disclosed herein. However, these flow cells 300, 400 are formed without TSVs providing thermal transfer from the silicon wafer 330, 420 (e.g., CMOS). In both flow cells, 300, 400, wire bonds 331, 431 are formed to electrically connect the silicon wafer die 330, 430 (e.g., sensor) to the carrier 397, 497 comprising the substrate 396, 496, but the placement of the portion of this connection on the carrier 397, 497 differs based on the shape of the one or more cavities and/or portions of cavities in each carrier 397, 497.

Turning now to FIG. 3, a portion of the cavity 305 in the carrier 397 which houses the sensor structure 342, is the same vertical height as the sensor structure 342 once the sensor structure is placed atop an under-fill layer 373. Fan-out regions 380 on either side of the sensor structure 342, and the sensor structure 342 itself, which has an upper surface that is a contiguous surface including the active surface 310 of a silicon wafer die 330 and portions of a fan-out region 380 on either side of this surface of the silicon wafer die 330, fill this portion of the cavity 305. This portion of the cavity can be understood as including a sensor structure cavity portion 309 (which can also be understood as a die cavity portion). Attached to portions of the fan-out regions 380 are bond pads 337. Thus, these bond pads are formed on a top surface of the silicon wafer die 330. As in FIGS. 1-2, the sensor structure 342 is placed in the cavity 305 on an under-fill 373, which serves as a transitional layer between the sensor structure 342 and the substrate 397. The silicon wafer die 330 (as well as the sensor structure 342) include a passivation layer 340, which is depicted as a separate layer in FIG. 3. This passivation layer 340 is not pictured as a separate layer in all the figures herein, despite its presence, in order to portray the silicon wafer die 330 (as well as the sensor structure 342) in a more simplistic manner.

In the example depicted in FIG. 3, the sensor structure 342 is electrically connected to topside substrate bond pads 341 on the carrier 396. Each topside substrate bond pads 341, at least one on each side of the portion of the cavity 305 housing the sensor structure 342, resides in a portion of the cavity 305 in the carrier 396 that begins adjacent to the fan-out region 380 on each side, at the vertical height of the sensor structure 342, but extends horizontally towards the walls 303 of the cavity 305 in the carrier 396. As is illustrated further when methods of forming this flow cell 300 and other examples are discussed, the horizontal space on each side of the cavity 305 is large enough to accommodate the topside substrate bond pads 341. In this flow cell 300, wire bonds 331 are formed to electrically connect the silicon wafer die 330 (e.g., sensor) to the carrier 397 comprising the substrate 396. These wire bonds 331 connect the bond pads 337 on a top surface of the silicon wafer die 330 to topside substrate bond pads 341. In this example, bond pads 337 on a top surface of the silicon wafer die 330 are connected to electrical vias 346. Some examples (not pictured) do not include these electrical vias 346. Although not pictured in FIG. 3, in some flow cells, for example, these topside substrate bond pads 341 are electrically connected to bottom substrate bond pads, through a single via, or alternatively, through several vias, that extend through multiple metallic layers of the substrate 396. The wire bonds may be composed of one or more metals, such as aluminum, copper, silver, gold, or any combination thereof. The metals in the wire bonds may be in elemental form, alloy form, or a composite form. For example, the wire bonding may comprise, for example, forming a eutectic metal bond.

In FIG. 3, the wire bonds 331 connecting the bond pads 337 on a top surface of the silicon wafer die 330 to topside substrate bond pads 341, the bond pads 337, and the topside substrate bond pads 341 are encapsulated. The material utilized to encapsulate the connection may or may not be the same filler material as utilized to form the fan-out regions 380. The encapsulation of the connection extends over the portion of the fan-out regions 380 upon which the bond pads 337 are formed and to a vertical height proximate to the vertical height of the walls 303 of the carrier 396 defining the horizontal boundaries of the entirety of the cavity 305. A (micro)-fluidic flow channel 392 is delineated by a lid 390 of the flow cell 300 on one side, a portion of the contiguous surface (not including the portions that include the encapsulated connection 328), including the active surface 310 of a silicon wafer die 330, and the encapsulation 328 of the connection. As will be discussed herein, the micro)-fluidic flow channel 392 is also partially delineated by a fluidics flow channel portion 311 (which can also be understood as a fluidics cavity portion), and a wire-bonding encapsulation portion 324 of the cavity 305. The carrier 396, and a top surface of the encapsulation 328 interface with the lid 390.

Horizontally, the (micro)-fluidic flow channel 392 is delineated by the lid 390 and the active surface 310.

Now turning to FIG. 4, the carrier 496, like the carrier in FIG. 1, includes a single cavity 405, in which the sensor structure 442 is placed, with an under-fill 473 forming an interface between a bottom surface of the sensor structure 442 and the top surface of the substrate 497 cavity 405. Like the sensor structure 342 of FIG. 3, the sensor structure of FIG. 4 includes bond pads 437 on the silicon wafer die 430. As with FIGS. 1-3, this silicon wafer die 430 is singulated from a wafer prior to being placed in the cavity 405. As will be discussed herein, the cavity includes two portions, the sensor structure 442 is positioned in the sensor structure cavity portion 409 (which can also be understood as a die cavity portion), and the fluidics flow channel portion of the cavity 405 delineates a portion of the (micro)-fluidic flow channel 492. Unlike in FIG. 3, the topside substrate bond pads 441, to which the bond pads 437 on the silicon wafer die 430 are located proximate to the outside edges of the cavity 405 in which the sensor structure 442 is placed (the sensor structure 442 being relatively centered in the cavity 405). In this flow cell 400, wire bonds 431 are formed to electrically connect the silicon wafer die 430 (e.g., sensor) to the carrier 497 comprising the substrate 496. These wire bonds 431 connect the bond pads 437 on a top surface of the silicon wafer die 430 to topside substrate bond pads 441 in the same portion of the cavity 405 (e.g., the sensor structure cavity portion 409). The connections, comprising the wire bonds 431, the bond pads 437, and the topside substrate bond pads 441 are encapsulated, forming a region of filler on each side of the sensor structure 442 to the wall 403 of the carrier 496 forming the sides of the cavity 405. The encapsulation of the connection 428 extends approximately to the vertical height of the walls 403 and above the sensor structure 442, in order to encapsulate the bond pads 437, covers at least a portion of the fan-out regions 480 on each side of the silicon wafer die 430. A (micro)-fluidic flow channel 492 is delineated by a lid 490 of the flow cell 400 on one side, a portion of the contiguous surface (not including the portions that include the encapsulated connection), including the active surface 410 of a silicon wafer die 430, and the encapsulation 428 the connection. The carrier 496, and a top surface of the encapsulation 428 interface with the lid 490. Horizontally, the (micro)-fluidic flow channel 492 is delineated by the lid 490 and the active surface 410. The silicon wafer die 430 (as well as the sensor structure 442) include a passivation layer 340, which is depicted as a separate layer in FIG. 3. This passivation layer 440 is not pictured as a separate layer in all the figures herein, despite its presence, in order to portray the silicon wafer die 430 (as well as the sensor structure 442) in a more simplistic manner.

Figure 5:
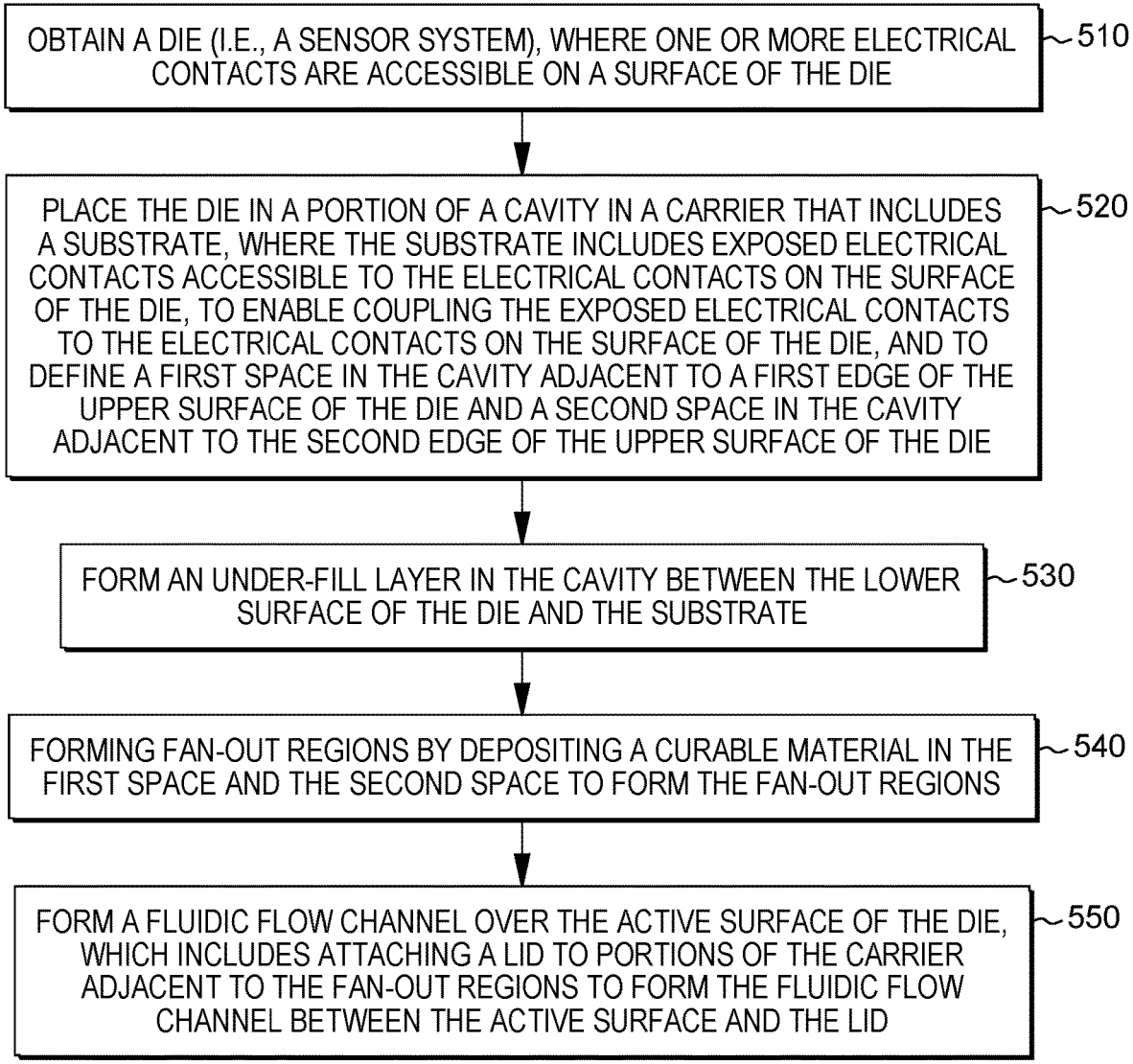
FIG. 5 depicts an example workflow that illustrates a process of manufacturing any of the flow cells of FIGS. 1-4.

FIG. 5 is a workflow 500 that illustrates certain aspects of some examples of disclosed herein of forming a flow cell, such as those depicted in FIGS. 1-4, in part by combining a carrier with a cavity 405 (the carrier includes a substrate) with a sensor structure that include a die. As illustrated in FIG. 5, for example, the method may include obtaining a die (i.e., a sensor system 142, 242, 342, 442), where one or more electrical contacts are accessible on a surface of the die (510). As illustrated in FIGS. 1-4, the electrical contacts on a die can be situated on different portions of the die, including but not limited to, an upper surface of the die, a portion of the upper surface of the die that includes an active surface, and/or a lower surface parallel to the upper surface. As illustrated in FIG. 5, the method may also include placing the die in a portion of a cavity 405 in a carrier that include a substrate, where the substrate includes exposed electrical contacts accessible to the electrical contacts on the surface of the die, such that the placing enables coupling the exposed electrical contacts to the electrical contacts on the surface of the die, and the placing defines a first space in the cavity adjacent to a first edge of the upper surface of the die and a second space in the cavity adjacent to the second edge of the upper surface of the die (520).

As illustrated in FIGS. 1-4, an under-fill 173, 273, 373, 473 can form an interface between the sensor structure 142, 242, 342, 442 and the bottom of the substrate cavity 105, 205, 305, 405, so the method of FIG. 5 includes forming an under-fill layer in the cavity between the lower surface of the die and the substrate (530). The method also includes, for example, forming fan-out regions by depositing a curable material in the first space and the second space to form the fan-out regions, a surface of the fan-out regions being contiguous with the upper surface of the die (540). As discussed above, forming a fluidic flow channel enables utilization of the flow cell for various purposes, this, the method includes forming a fluidic flow channel over the active surface of the die, which includes attaching a lid to portions of the carrier adjacent to the fan-out regions to form the fluidic flow channel between the active surface and the lid (550).

Keeping in mind the general workflow 500 of FIG. 5, FIGS. 6A-8C illustrate, in more detail, examples of various aspects of the formation of the flow cell 100 of FIG. 1.

Figure 6A:
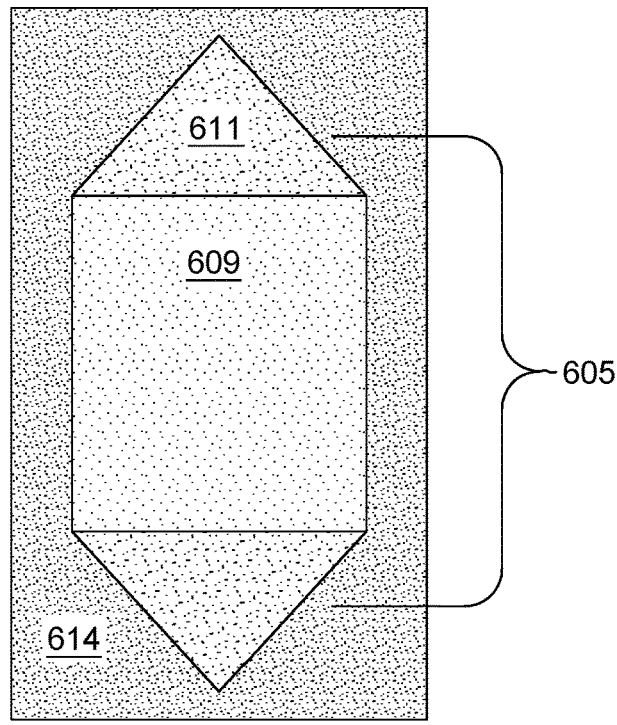
FIGS. 6A-6C depict, in one example, various views of a substrate with one or more pre-engineered cavities such that the substrate can be utilized in a method of manufacturing the flow cell of FIG. 1.
Figure 6B:
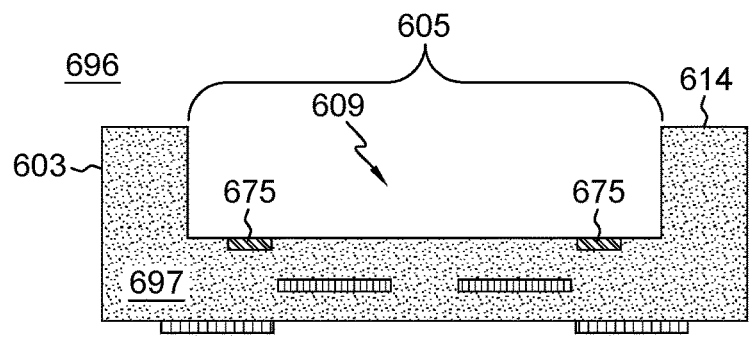
Figure 6C:
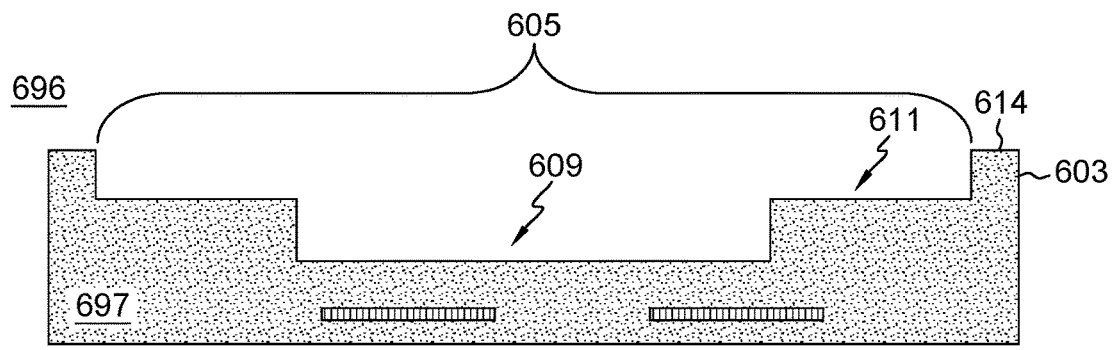

Referring to FIGS. 6A-6C, FIG. 6A is a top view of the carrier 196, 696 also depicted in FIG. 1, which includes a substrate 697. The cavity 605 in this carrier 696 has different sections of different depths (heights) that serve different purposes, once in the formation of a flow cell 100 (FIG. 1). One section of the cavity 605, the sensor structure cavity portion 609 (which can also be understood as a die cavity portion), is approximately, and in some instances exactly, the vertical height of the sensor structure (this height is a height after a pick and place of the sensor structure in the cavity 605 on the under-fill +/−standard tolerances; an example of a standard tolerance compatible with the illustrated example is about +/−3 um with theta of about +/−0.07 degrees). A second section, a fluidics flow channel portion 611 (which can also be understood as a fluidics cavity portion), has a depth that begins at the top of the sensor structure cavity portion 609 and defines a height of the eventual fluidics flow channel portion of the flow cell 100 (FIG. 1)(e.g., about 100 um). The cavity 605 is bounded by walls 603, which include the highest points of the carrier 696. It is at the top surface of the walls 603 (e.g., FIGS. 6B-6C) that the carrier 696 interfaces with a lid, for example. To create this interface, as will be explained herein, an interface may be applied to the top surface of the walls 603 (e.g., FIGS. 6B-6C).

FIG. 6B is a horizontal cross sectional view of the carrier 696 of FIG. 6A. This view illustrates the electrical contacts 675 in the cavity 605, which the sensor structure 142 (FIG. 1) is electrically coupled to, via electrical contacts of the sensor structure 142 (FIG. 1) (e.g., pillar bumps 170 and pads 160) and the aforementioned under-fill 173 (FIG. 1). In this view, a differential in heights of the sensor structure cavity portion 609, the fluidics flow channel portion 611, and the walls 603, is more apparent. Some examples of electrical contacts 675 are also illustrated. It is at the top surface 614 of the walls 603 that the carrier 696 may interface with a lid 190 (e.g., FIG. 1).

FIG. 6C is a vertical cross sectional view of the carrier 696. From this vantage point, the differentials in vertical height between the sensor structure cavity portion 609, the fluidics flow channel portion 611, and the walls 603, bounding the entirety of the cavity 605, are more visible.

Figure 7A:
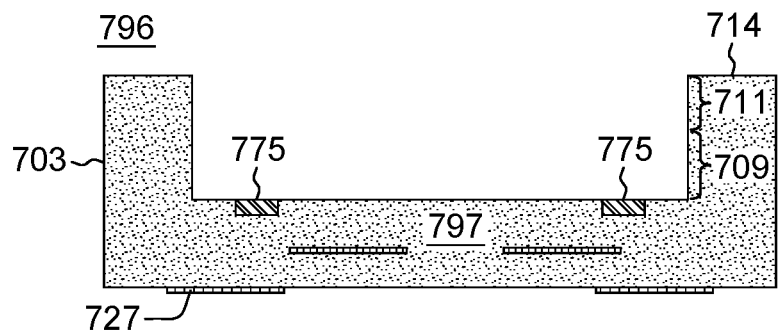
FIGS. 7A-7E depict, in one example, a cross section of the substrate of FIGS. 6A-6C, at different points of a process for manufacturing the flow cell of FIG. 1.

FIGS. 7A-7E illustrate certain aspects of a method for forming the flow cell 100 of FIG. 1. FIG. 7A is another cross sectional view of carrier 696 of FIG. 6A. Although not as visually obvious as in FIG. 6A (because the horizontal distance of the walls 703 from the sensor structure cavity portion 709 (which can also be understood as a die cavity portion) throughout the fluidics flow channel portion 711, vary), FIG. 7A depicts carrier 796 (similar to carrier 696), which includes the sensor structure cavity portion 709, the fluidics flow channel portion 711 (which can also be understood as a fluidics cavity portion), and the walls 703. The carrier 796 comprises a substrate and may be formed from materials including, but not limited to a printed circuit board (PCB) and/or a ceramic circuit board. Electrical contacts 775 on the substrate of the carrier 796 are exposed such that they can be electrically coupled to the sensor structure (not pictured). The carrier 796 includes internal electrical lines (not pictured) to route signal from the bottom (back) of the sensor structure (not pictured) to the back of the carrier 727. Hence, the carrier 796 comprises features (e.g., thermal vias) that enable thermal transfer from the back of the carrier 727 to the sensor structure (e.g., the CMOS of the structure).

Figure 7B:
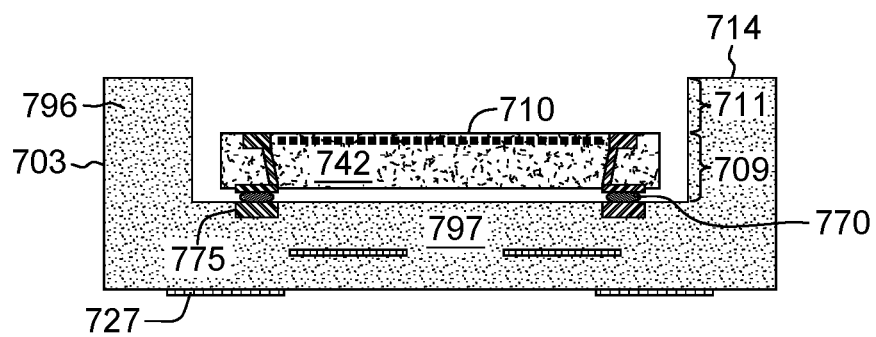

Referring to FIG. 7B, as illustrated herein, a die, a sensor structure 742, is picked and placed in the sensor structure cavity portion 709 such that one or more electrical contacts (e.g., TSV 720, pillar bumps 770, back side pads bumped) are coupled to the electrical contacts 775 on the substrate 727 of the carrier 796. The die or sensor structure 742, in this example, is singulated. In some examples, certain portion(s) of the die or sensor structure is coated with a polymeric material. The polymeric material may be, for example, a gel-based material, such as a polyacrylamide gel coating, including, for example, poly(N-(5-azidoacetamidylpentyl) acrylamide-co-acrylamide-co-acrylonitrile) ("PAZAM"). In one example, the die or sensor structure includes at least one nanowell at the surface, and the coating is present at the bottom and/or sidewall portions of the nanowell. After the coating is applied, at least a portion of the coating is polished. The die or sensor structure 742 may be coated before or after assembly with the carrier 796. In one example, the die or sensor structure 742 is coated before assembly with the carrier 796. When the sensor structure 742 is picked and placed into the sensor structure cavity portion 709, electrical connection is made (e.g., by reflowing the pillar bumps 770, using anisotropic conductive films to made contact between the pillar bumps 770 and the electrical contacts 775).

Figure 7C:
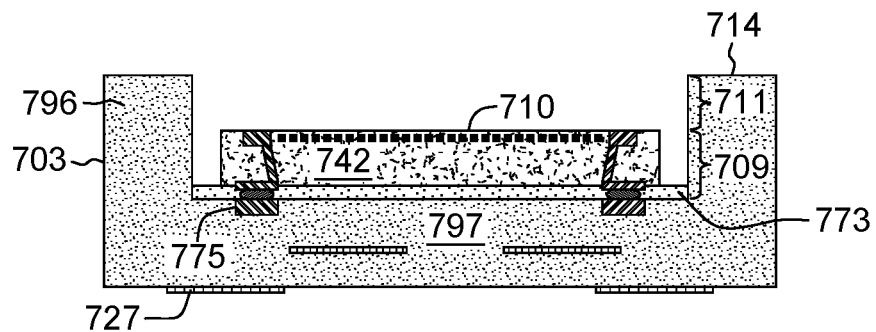

FIG. 7C illustrates formation of an under-fill 773 layer, which can be accomplished by dispensing a given volume of under-fill material. As discussed earlier, in the illustrated examples herein, the under-fill 773 provides an interface between the sensor structure 742 and the substrate 797. Low viscosity epoxy materials are examples of possible under-fill materials. Specific under-fill materials which can be utilized in the illustrated examples include Loctite Eccobond series (Henkel) and/or EP29LPTCHT (MasterBond). In one example, an under-fill material is a low viscosity epoxy material that is serviceable from about −65° F. to about +250° F. with a viscosity of about 200 cps at about 75° F. The under-fill may enable a thickness after bonding of about 10 um to about 500 um, depending, in part, on what is encapsulated under the die and of the total stack thickness.

Figure 7D:
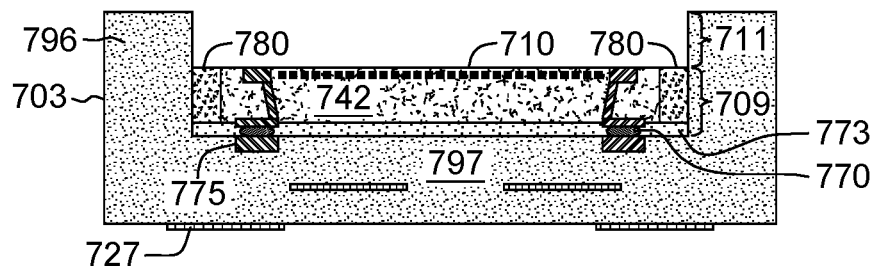

In FIG. 7D, a fan-out region 780 is formed by depositing a curable material to fill a remainder of sensor structure cavity portion 709 (e.g., unfilled spaces on either side of the sensor structure 742). Because portions of the carrier 796 bound the sensor structure cavity portion 709, the curable material comprising the fan-out region 780 can be dispensed without any molding structure. The curable material may include, but is not limited to, epoxy and/or glue. Methods of curing this material may include, but are not limited to, one or more of ultraviolet exposure and/or thermal exposure. The curable material is dispensed such that the resulting fan-out region 780 is at least comparable in height to the active surface 710 of the sensor structure 742. In certain implementations, a top surface of the fan-out region 780 has the substantially the same height as the top surface of the sensor structure 742. In certain implementations, a top surface of the fan-out region 780 is flush with the top surface of the sensor structure 742. The fan-out region 780 does not extend into the fluidics flow channel portion 711. When implemented, the material that forms the fan-out region 780 (e.g., epoxy, glue) may planerize or make a smooth transition between the active surface 710 of the sensor structure 742 and a surface of the substrate 797, making a transition for fluidics to flow. The material may also, for example, covers gap(s) and connects with the wall 703 (the side wall of the deeper cavity), at an angle of connection.

Figure 7E:
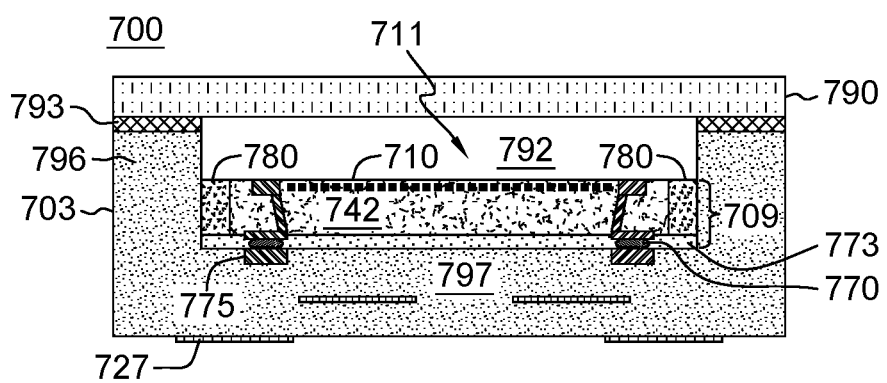

FIG. 7E illustrates the flow cell 700 after formation of a fluidic flow channel 792 in the fluidics flow channel portion 711 of the carrier 796. The fluidic flow channel 792 is formed over the active surface 710 of the die (sensor structure 742), by attaching a lid 790 to portions of the carrier 796 adjacent to the fan-out regions 780, to form the fluidic flow channel between the active surface 710 and the lid 790. For example, an adhesive is applied to the lid 790 and the carrier 796, at an upper surface of each wall 703 of the carrier 790. Adhesive forms an interface 793 between an upper surface of each wall 703 of the carrier 790 and the lid 790.

Figure 8A:
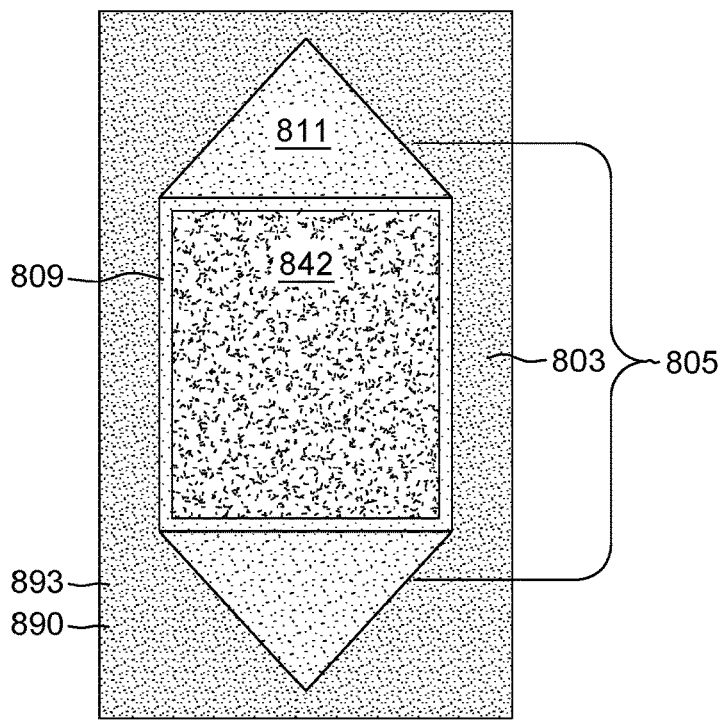
FIGS. 8A-8C depict, in one example, various views of an example of a flow cell manufactured utilizing the methods illustrated by FIG. 5 and FIGS. 7A-7E.
Figure 8B:
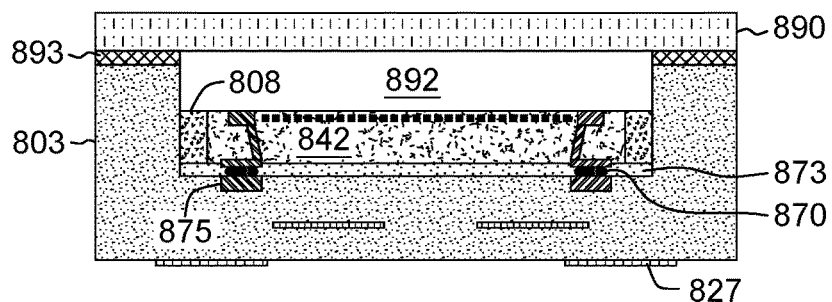

FIG. 8A is a top view of the flow cell 800 formed utilizing the method illustrated in FIGS. 7A-7E. This can also be understood as a top view of the flow cell 700 in FIG. 7E. As seen from this view, sensor structure 842 is visible through a translucent lid 890. The sensor structure 842 is positioned in the sensor structure cavity portion 809 (which can also be understood as a die cavity portion). The fluidics flow channel portion 811 (which can also be understood as a fluidics cavity portion) and the walls 803 of the interface 893 are also illustrated. As illustrated in FIG. 8A, the fluidics flow channel portion 811 extends, at different points, as bounded by the walls 803, varying horizontal distances from the sensor structure cavity portion 809 housing the sensor structure 842. In this example, the shape is a triangle on either side of the sensor structure cavity portion 809. FIG. 8B is a horizontal cross sectional view of the flow cell 800, portions of which are described in the discussion of FIG. 7E.

Figure 8C:
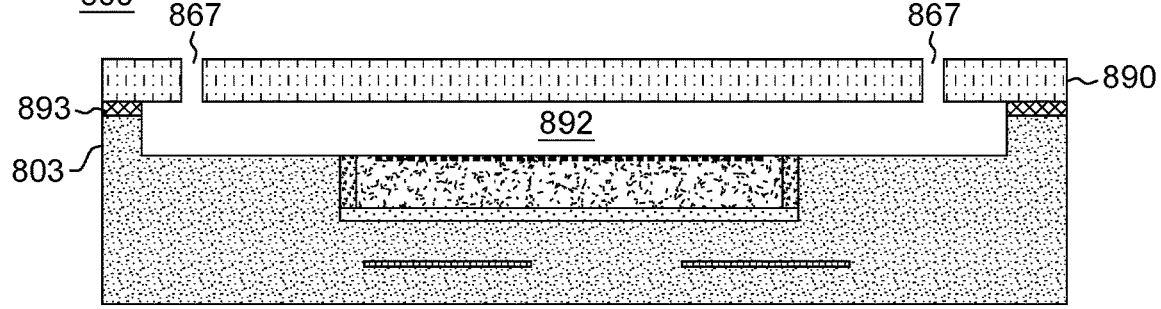

FIG. 8C is a vertical cross sectional view of the flow cell 800. From this point of view, fluidics holes 867, providing an inlet and/or an outlet for the fluid in the (micro)-fluidic flow channel 892 are visible in the lid 890. The shape and orientation of the cavity 805 in the carrier 896 changes the shape of the (micro)-fluidic flow channel 892.

In accordance with certain aspects of the general workflow 500 of FIG. 5, FIGS. 9A-11B illustrate, in more detail, examples of various aspects of the formation of the flow cell 200 of FIG. 2.

Figure 9A:
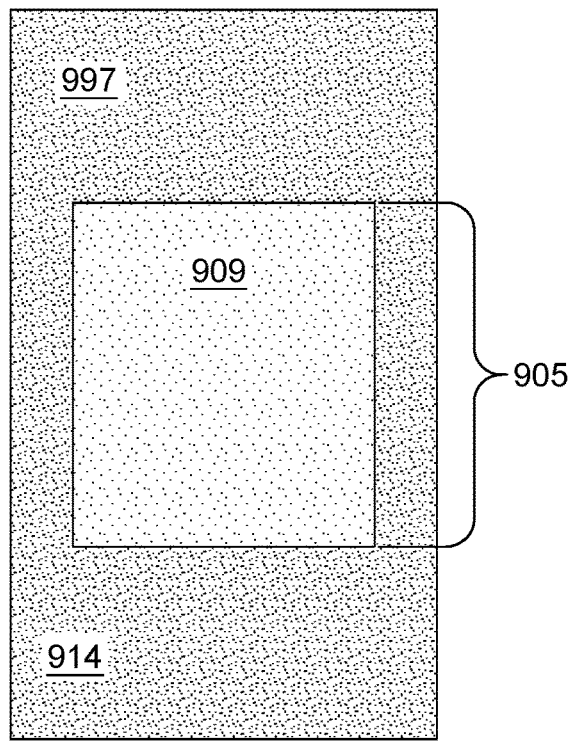
FIGS. 9A-9C depict, in one example, various views of a substrate with one or more pre-engineered cavities such that the substrate can be utilized in a method of manufacturing the flow cell of FIG. 2.

Referring first to FIG. 9A is a top view of the carrier 296 (FIG. 2), 996 also depicted in FIG. 2, which includes a substrate 997. The cavity 905 in this carrier 996 has a single section, a sensor structure cavity portion 909 (which can also be understood as a die cavity portion) that is approximately, and in some instances exactly, the vertical height of the sensor structure 942 (this height is a height after a pick and place of the sensor structure 942 in the cavity 905 on the under-fill +/−standard tolerances; for example, a standard tolerance may range from about +/−1 um to about +/−10 um). The cavity 905, all of which is a sensor structure cavity portion 909, is bounded by walls 903 (FIGS. 9B-9C), which are the highest points of the carrier 996. To create an interface between a lid 290 (FIG. 2) and the carrier 996, an interface is formed between a high structure (a spacer) attached to the top surface of the walls 903, and the lid 990.

Figure 9B:
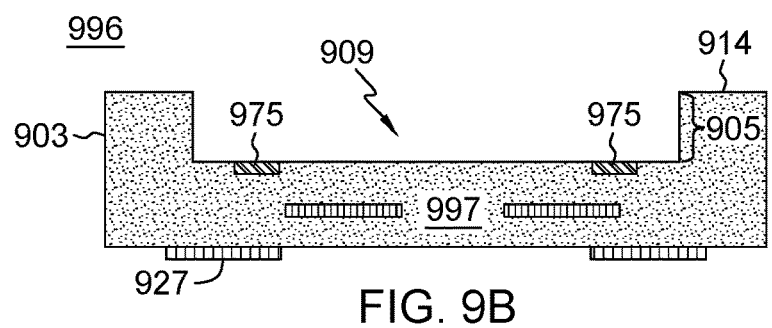
Figure 9C:
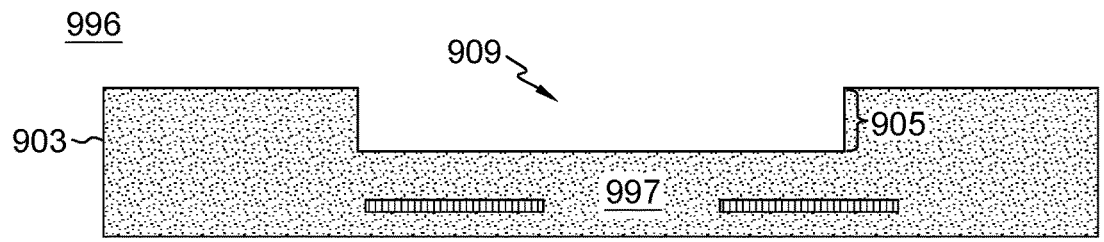

FIG. 9B is a horizontal cross sectional view of the carrier 996 of FIG. 9A. This view illustrates the electrical contacts 975 in the cavity 905, which the sensor structure 242 (FIG. 2) is to be electrically coupled to, via electrical contacts of the sensor structure 242 (FIG. 2) (e.g., pillar bumps 170 and pads 160) and the aforementioned under-fill 273 (FIG. 2). In this example, a high structure (a spacer) attached to the top surface of the walls 903 interfaces with a lid 290 (FIG. 2) to form a (micro)-fluidic flow channel 292 (FIG. 2).

Figure 10A:
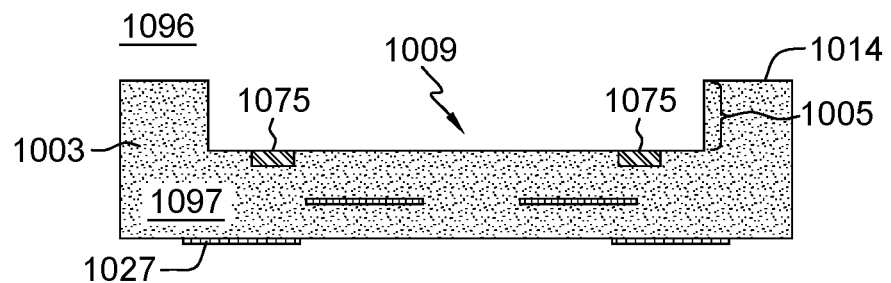
FIGS. 10A-10E depict, in one example, a cross section of the substrate of FIGS. 9A-9C, at different points of a process for manufacturing the flow cell of FIG. 2.

FIGS. 10A-10E illustrate certain aspects of a method for forming the flow cell 200 of FIG. 2. FIG. 10A is another cross sectional view of carrier 1096 of FIG. 10A. FIG. 10A, depicts carrier 1096 (similar to carrier 996), with only a sensor structure cavity portion 1009 (which can also be understood as a die cavity portion) comprising the cavity 1005, defined by walls 1003. The carrier 1096 comprises a substrate and may be formed from materials including, but not limited to a printed circuit board (PCB) and/or a ceramic circuit board. Electrical contacts 1075 on the substrate of the carrier 1096 are exposed such that they can be electrically coupled to the sensor structure (not pictured). The carrier 1096 includes internal electrical lines (not pictured) to route signal from the bottom (back) of the sensor structure (not pictured) to the back of the carrier 1027. Hence, the carrier 1096 comprises features (e.g., thermal vias) that enable thermal transfer from the back of the carrier 1027 to the sensor structure (e.g., the CMOS of the structure).

Figure 10B:
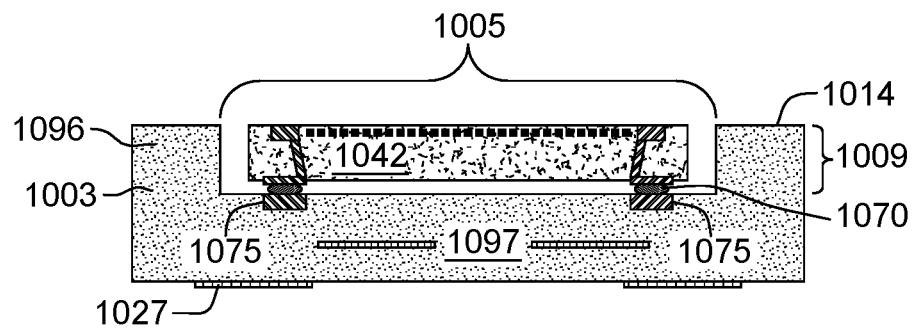

Referring to FIG. 10B, as illustrated herein, a die, a sensor structure 1042, is picked and placed in the sensor structure cavity portion 1009 such that one or more electrical contacts (e.g., TSV 1020, pillar bumps 1070, back side pads bumped) are coupled to the electrical contacts 1075 on the substrate of the carrier 1096. The die or sensor structure 1042, in this example, is singulated. In some examples, certain portion(s) of the die or sensor structure is coated with a polymeric material. The polymeric material may be, for example, a gel-based material, such as a polyacrylamide gel coating, including, for example, poly(N-(5-azidoacetamidylpentyl) acrylamide-co-acrylamide-co-acrylonitrile) ("PAZAM"). In one example, the die or sensor structure includes at least one nanowell at the surface, and the coating is present at the bottom and/or sidewall portions of the nanowell. After the coating is applied, at least a portion of the coating is polished. The die or sensor structure 1042 may be coated before or after assembly with the carrier 1096. In one example, the die or sensor structure 1042 is coated before assembly with the carrier 1096. When the sensor structure 1042 is picked and placed into the sensor structure cavity portion 1009, electrical connection is made (e.g., by reflowing the pillar bumps 1070, using anisotropic conductive films to made contact between the pillar bumps 1070 and the electrical contacts 1075.

Figure 10C:
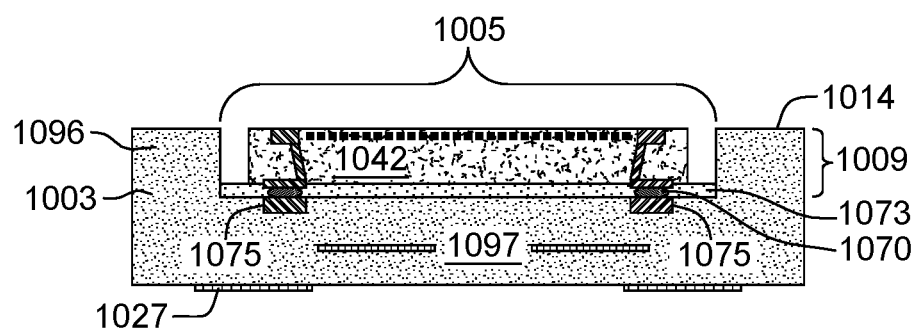

FIG. 10C illustrates formation of an under-fill 1073 layer, which can be accomplished by dispensing a given volume of under-fill material. Low viscosity epoxy materials are examples of possible under-fill materials. Specific under-fill materials which can be utilized in the illustrated examples include Loctite Eccobond series (Henkel) and/or EP29LPTCHT (MasterBond). In one example, an under-fill material is a low viscosity epoxy material that is serviceable from about −65° F. to about +250° F. with a viscosity of about 200 cps at about 75° F. The under-fill may enable a thickness after bonding of about 10 um to about 500 um, depending, in part, on what is encapsulated under the die and of the total stack thickness. As discussed earlier, in the illustrated examples herein, the under-fill 1073 provides an interface between the sensor structure 1042 and the substrate 1097.

Figure 10D:
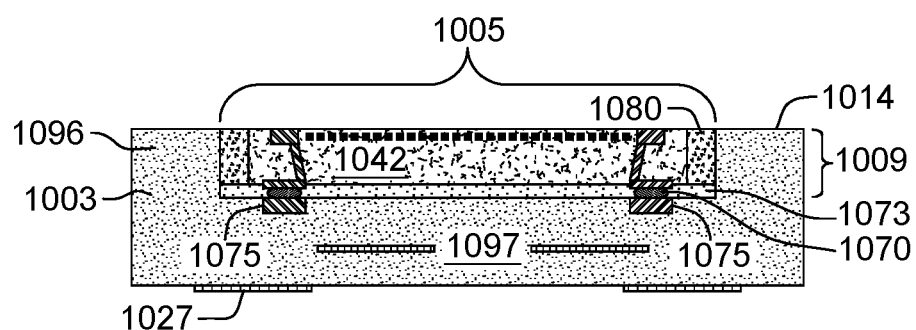

In FIG. 10D, a fan-out region 1080 is formed by depositing a curable material to fill a remainder of sensor structure cavity portion 1009 (e.g., unfilled spaces on either side of the sensor structure 1042 in the cavity 1005). Because portions of the carrier 1096 bound (e.g., the walls 1003) the sensor structure cavity portion 1009, the curable material comprising the fan-out region 1080 can be dispensed without any molding structure. The curable material may include, but is not limited to, epoxy and/or glue. Methods of curing this material may include, but are not limited to, one or more of ultraviolet exposure and/or thermal exposure. The curable material is dispensed such that the resulting fan-out region 1080 is approximately the same height as the walls 1003 of the carrier 1096. Thus, a contiguous surface is formed comprising the top surface of the walls 1014 of the carrier 1096, the fan-out regions 1080, and the active surface 1010 of the sensor structure 1042 (e.g., the die). When implemented, the material that forms the fan-out region 1080 (e.g., epoxy, glue) may planerize or make a smooth transition between the active surface 1010 of the sensor structure 1042 and a surface of the substrate 1097, making a transition for fluidics to flow. The material may also, for example, covers gap(s) and connect with the wall 1003 (the side wall of the deeper cavity), at an angle of connection.

Figure 10E:
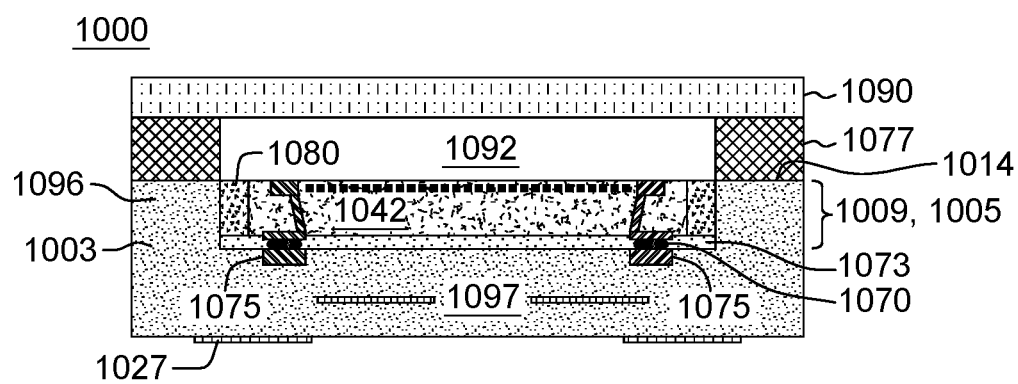

FIG. 10E illustrates the flow cell 1000 after formation of a fluidic flow channel 1092. A high structure 1077 (e.g., a spacer) is attached to a portion of the top surface of the walls 1014 of the carrier 1096. The spacer may be comprised of various materials, including but not limited to an adhesive (e.g., a double sided adhesive), an epoxy, an epoxy with a solid filler, etc. For example, the spacer can be a thin layer of about 10-50-100-500 um thick, which is glued to both sides.

The fluidic flow channel 1092 is formed over the active surface 1010 of the die (sensor structure 1042), by attaching a lid 1090 to a top surface of the high structure 1077, to form the fluidic flow channel 1011 between the active surface 1010 and the lid 1090. For example, an adhesive is applied to the lid 1090 and the top surface of the high structure 1077. Adhesive forms an interface between the top surface of the high structure 1077 and the lid 1090.

Figure 11A:
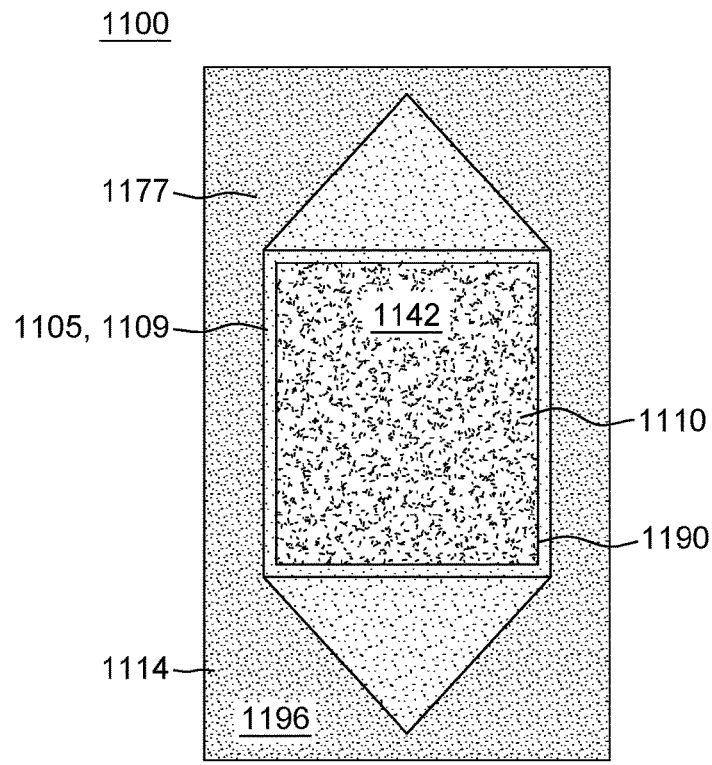
FIGS. 11A-11C depict various views of an example of a flow cell manufactured utilizing the methods illustrated by FIG. 5 and FIGS. 10A-10E.
Figure 11B:
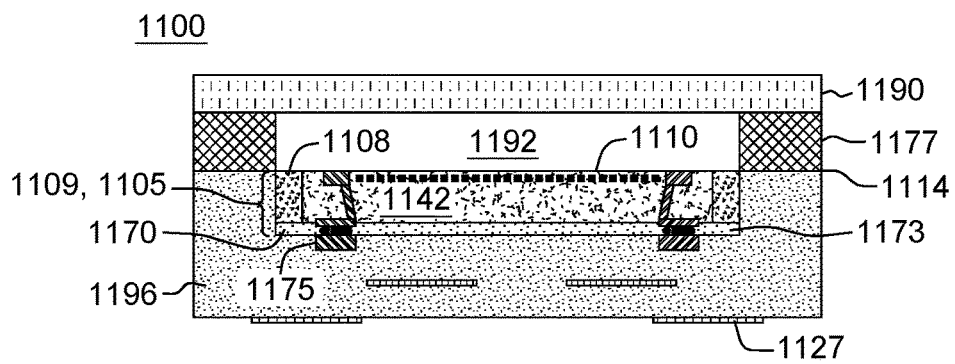

FIG. 11A is a top view of the flow cell 1100 formed utilizing the method illustrated in FIGS. 10A-10E. This can also be understood as a top view of the flow cell 1000 in FIG. 10E. As seen from this view, sensor structure 1142 is visible through a translucent lid 1190. The sensor structure 1142 is positioned in the sensor structure cavity portion 1109 (which can also be understood as a die cavity portion), the cavity 1105 engineered into the carrier 1196 before the pick and place process. As there is one section in this cavity 1105, the sensor structure cavity portion 1109 is the cavity 1105. The fluidics flow channel 1192 is delineated by the high structure 1177, the active surface 1110, and the lid 1190. Because of the portion of the top surface of the walls 1114 to which the high structure 1177 (spacer) is attached, the (micro)-fluidic flow channel 1192 of FIG. 11A is similar in shape to the (micro)-fluidic flow channel 892 of FIG. 8A. It is this shape that enables these two examples to share similar utility. Some examples of shapes that enable good fluidics (for the uses described herein) and fluid exchange include but are not limited to, a diamond shape and a rugby ball shape. FIG. 11B is a horizontal cross sectional view of the flow cell 1100, portions of which are described in the discussion of FIG. 10E.

Figure 11C:
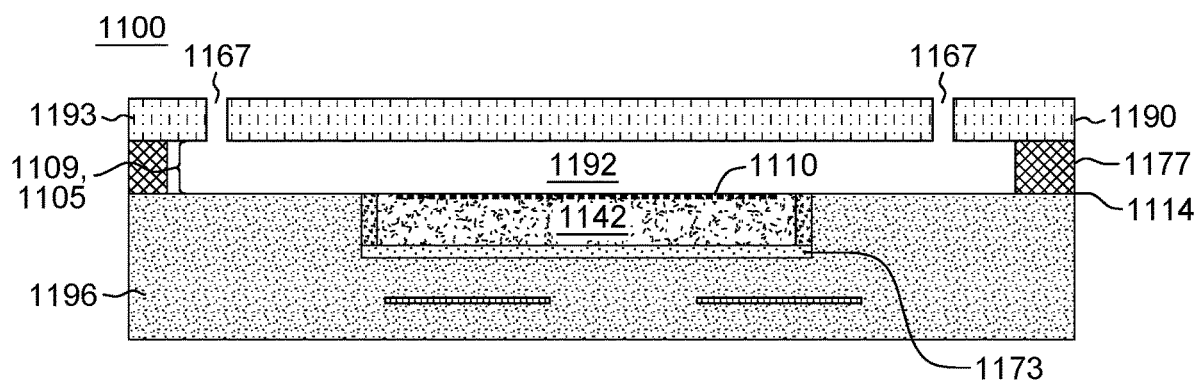

FIG. 11C is a vertical cross sectional view of the flow cell 1100. From this point of view, fluidics holes 1167, providing an inlet and/or an outlet for the fluid in the (micro)-fluidic flow channel 1192 are visible in the lid 1190. The shape and orientation of the cavity 1105 in the carrier 1196 changes the shape of the (micro)-fluidic flow channel 1192.

FIGS. 12A-14C illustrate, in more detail, examples of various aspects of the formation of the flow cell 300 of FIG. 3. These carriers formed with the methods discussed below do not utilize TSVs to provide electrical and/or thermal conductivity. Thus, certain differences exist in the carrier in order to accommodate this difference in the sensor structure.

Figure 12A:
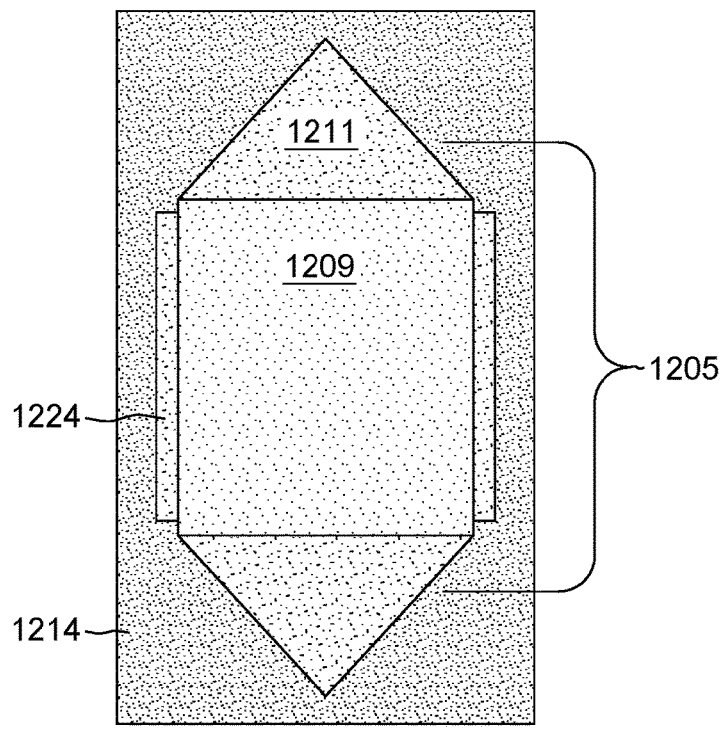
FIGS. 12A-12C depict, in one example, various views of a substrate with one or more pre-engineered cavities such that the substrate can be utilized in a method of manufacturing the flow cell of FIG. 3.
Figure 12B:
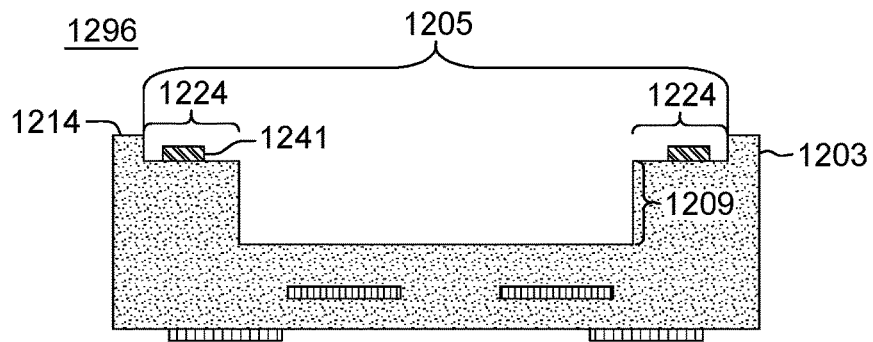
Figure 12C:
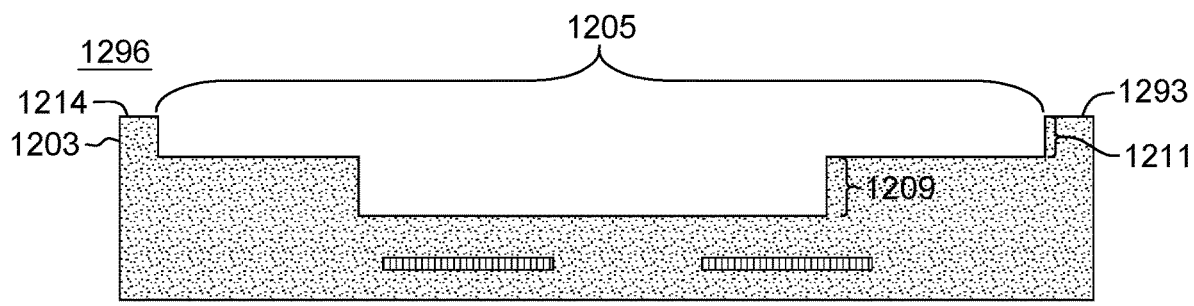

FIG. 12A is a top view of the carrier 396, 1296 also depicted in FIG. 3, which includes a substrate 397. Like the cavity in FIGS. 6A-6C, the cavity 1205 in this carrier 1296 has different sections of different depths (heights) that serve different purposes, in the formation of a flow cell 300 (FIG. 3). However, as the electrical connections differ, so does the usage of the different portions of the cavity 1205. Referring to FIGS. 12A-12C, as the various views provide clearer illustrations of certain aspects. One section of the cavity 1205, the sensor structure cavity portion 1209 (which can also be understood as a die cavity portion), is approximately, and in some instances exactly, the vertical height of the active surface of the sensor structure (this height is a height after a pick and place of the sensor structure in the cavity 1205+/−standard tolerances; the standard tolerances depend, in part, on the material and process use, but in this example, the standard tolerance may be about +/−1-10 um). A second section, a fluidics flow channel portion 1211 (which can also be understood as a fluidics cavity portion), has a depth that begins at the top of the sensor structure cavity portion 1209 and defines a height of the eventual fluidics flow channel portion of the flow cell 1200 (e.g., about 100 um). A third section, a wire-bonding encapsulation portion 1224, is only located on two sides of the carrier 1296, hence being visible in FIG. 12B and FIG. 12A, but not in FIG. 12C. This third section has a depth that begins at the top of the sensor structure cavity portion 1209. The cavity 1205 is bounded by walls 1203, which are the highest points of the carrier 1296. It is at the top surface of the walls 1203 that the carrier 1296 interfaces with a lid, in this illustrated example. However, the lid also interfaces with portions of the encapsulated electrical connection. To create this interface, as will be explained herein, an interface may be applied to the top surface 1214 of the walls 1203 and well as a portion of the encapsulation of the electrical connections.

FIG. 12B is a cross sectional view of the carrier 1296 of FIG. 12A. This view illustrates the electrical contacts, the topside substrate bond pads 1241, which are located in the wire-bonding encapsulation portion 1224 of the cavity 1205. The sensor structure 342 (FIG. 3) is electrically coupled to these topside substrate bond pads 1241, via wire bonds 331 (FIG. 3) from electrical contacts (e.g., bond pads 337 the on the die (FIG. 3)) of the sensor structure 342 (FIG. 3). In this view, a differential in heights of the sensor structure cavity portion 1209, the wire-bonding encapsulation portion 1224, and the walls 1203, is more apparent. In order to potentially enhance thermal performance, thermal vias may be integrated into the carrier 1296.

FIG. 12C is a vertical cross sectional view of the carrier 1296. From this vantage point, the differentials in vertical height between the sensor structure cavity portion 1209, the fluidics flow channel portion 1211, and the walls 1203, bounding the entirety of the cavity 1205, are more visible.

Figure 13A:
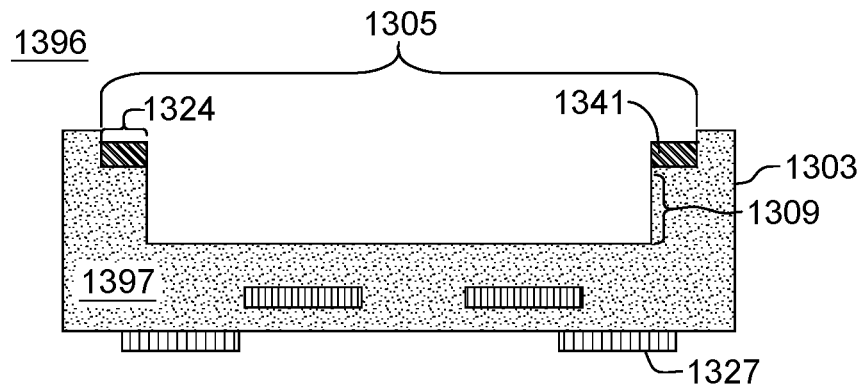
FIGS. 13A-13F depict, in one example, a cross section of the substrate of FIGS. 12A-12C, at different points of a process for manufacturing the flow cell of FIG. 3.

FIGS. 13A-13E illustrate certain aspects of a method for forming the flow cell 300 of FIG. 3. FIG. 13A is another cross sectional view of carrier 1296 of FIG. 12A. Although not as visually obvious as in FIG. 12A (because the horizontal distance of the walls 1203 from the sensor structure cavity portion 1209 throughout the wire-bonding encapsulation portion 1224, vary), FIG. 13A depicts carrier 1396 (similar to carrier 1296), which includes the sensor structure cavity portion 1309 (which can also be understood as a die cavity portion), the wire-bonding encapsulation portion 1324, and the walls 1303. The carrier 1396 comprises a substrate and may be formed from materials including, but not limited to a printed circuit board (PCB) and/or a ceramic circuit board. Electrical contacts on the substrate comprise topside substrate bond pads 1341, which are situated at a lowest vertical height (a base surface) of the wire-bonding encapsulation portion 1324, on the carrier 1396, such that they can be electrically coupled to the sensor structure (not pictured). Not pictured are connections between layers of the substrate 1397 (e.g., additional metal layers of substrate/PCB with via connections between layers that are not shown) which comprise internal electrical lines which to route signal from the bottom the bond pads 1341 to the back of the carrier 1327.

Figure 13B:
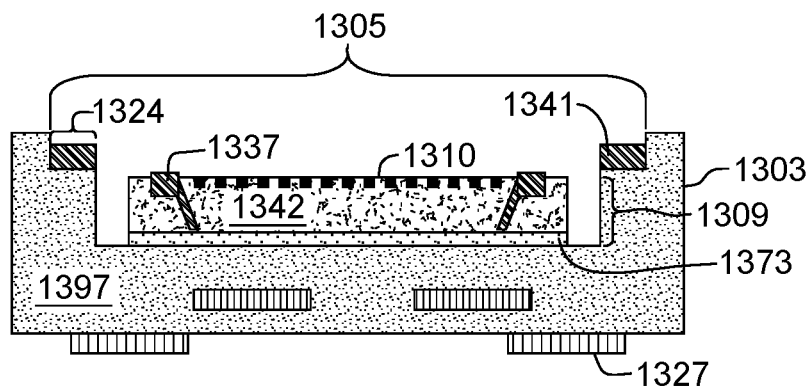

Referring to FIG. 13B, as illustrated herein, a die, a sensor structure 1342, is picked and placed in the sensor structure cavity portion 1309. The die or sensor structure 1342, in this example, is singulated. In some examples, certain portion(s) of the die or sensor structure is coated with a polymeric material. The polymeric material may be, for example, a gel-based material, such as a polyacrylamide gel coating, including, for example, poly(N-(5-azidoacetamidylpentyl) acrylamide-co-acrylamide-co-acrylonitrile) ("PAZAM"). In one example, the die or sensor structure includes at least one nanowell at the surface, and the coating is present at the bottom and/or sidewall portions of the nanowell. After the coating is applied, at least a portion of the coating is polished. The die or sensor structure 1342 may be coated before or after assembly with the carrier 1396. In one example, the die or sensor structure 1342 is coated before assembly with the carrier 1396. FIG. 13B also illustrates formation of an under-fill 1373 layer, which can be accomplished by dispensing a given volume of under-fill material, as discussed in FIGS. 7 and 11. As discussed earlier, in the illustrated examples herein, the under-fill 1373 provides an interface between the sensor structure 1342 and the substrate 1397.

Figure 13C:
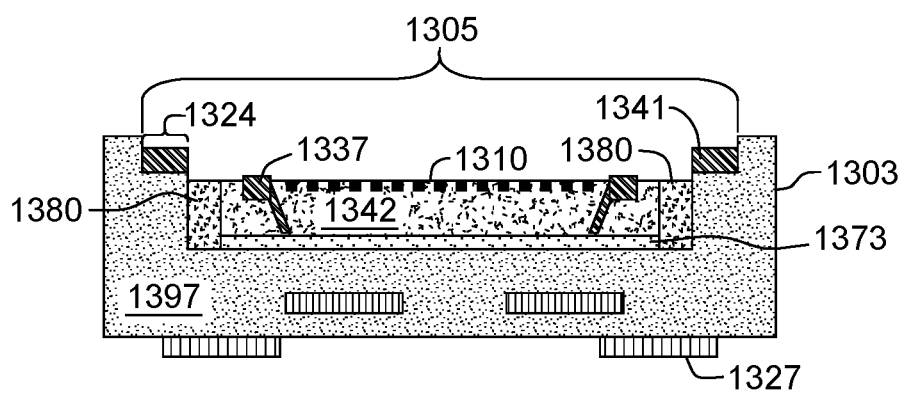

In FIG. 13C, a fan-out region 1380 is formed by depositing a curable material to fill a remainder of sensor structure cavity portion 1309 (e.g., unfilled spaces on either side of the sensor structure 1342). Because portions of the carrier 1396 bound the sensor structure cavity portion 1309, the curable material comprising the fan-out region 1380 can be dispensed without any molding structure. The curable material may include, but is not limited to, epoxy and/or glue. Methods of curing this material may include, but are not limited to, one or more of ultraviolet exposure and/or thermal exposure. The curable material is dispensed such that the resulting fan-out region 1380 is at least comparable in height to the active surface 1310 of the sensor structure 1342. The fan-out region 1380 does not extend into the wire-bonding encapsulation portion 1324 of the cavity 1309.

Figure 13D:
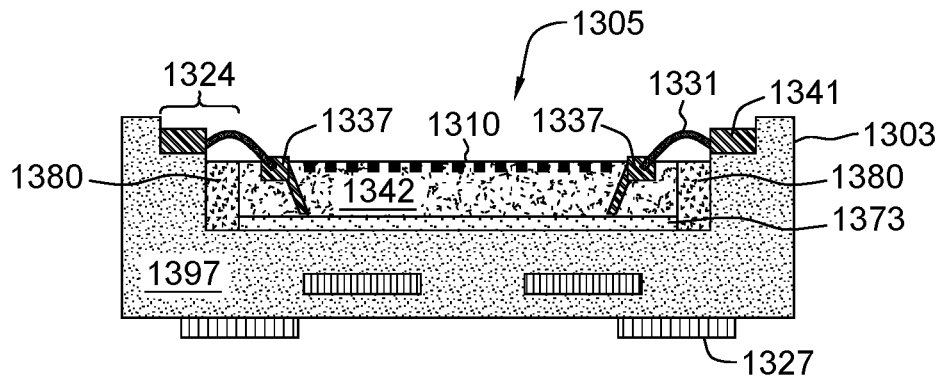

FIG. 13D illustrates wire-bonding the topside substrate bond pads 1341 to the pads on the carrier 1337, in the wire-bonding encapsulation portion 1324 of the cavity 1309. The wire bonds may be composed of one or more metals, such as aluminum, copper, silver, gold, or any combination thereof. The metals in the wire bonds may be in elemental form, alloy form, or a composite form. For example, the wire bonding may comprise, for example, forming a eutectic metal bond.

Figure 13E:
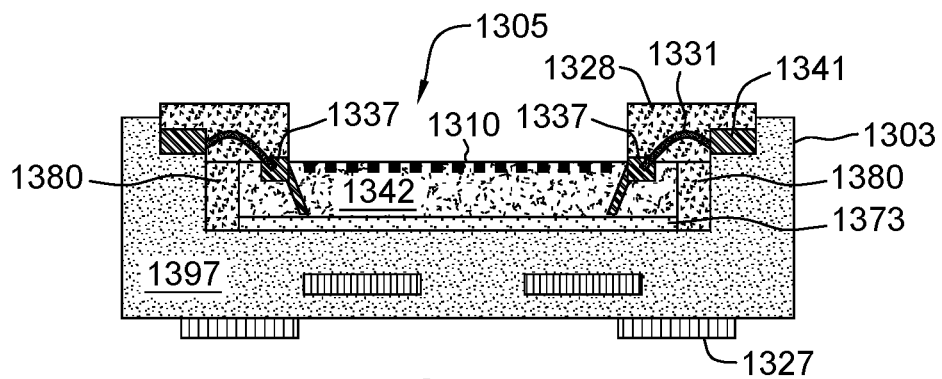
Figure 13F:
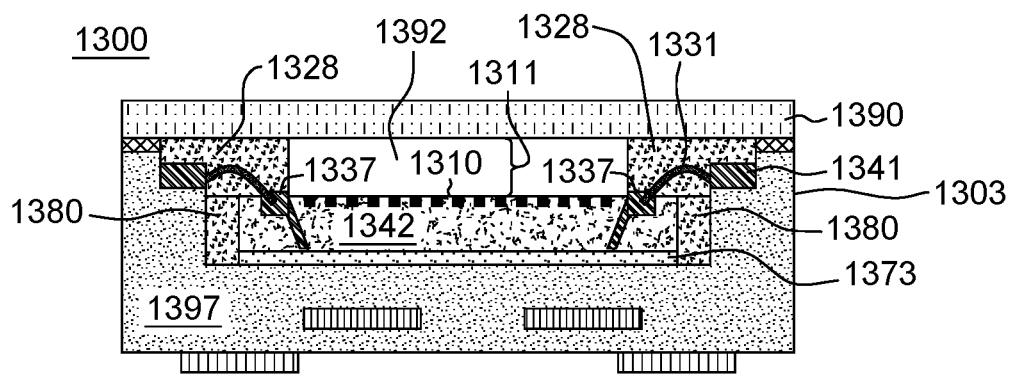

FIG. 13E illustrates encapsulating the wire-bonded connection (forming the encapsulation of the connection 1328). One or more pin may be utilized to ensure that the material used for encapsulation 1328 (e.g., a curable material, which may be the same material used to form the fan-out regions 1380), does not flow onto the active surface 1310 of the sensor structure 1342. In encapsulating the connection, including the wire bonds 1331, the bond pads 1337 (on the die), and the topside substrate bond pads 1341 (on the substrate 1397), the wire-bonding encapsulation portion 1324 of the cavity is filled with the curable material. The top surface of the encapsulation 1328 (e.g., glue, epoxy) may not be flat initially and may be flattened when placing the glass lid, as illustrated in FIG. 13F. The encapsulation 1328, in part, bounds the fluidic flow channel and thus, the shape of side walls of the encapsulation 1328 can contribute to the utility of the flow cell. For example, the walls of the encapsulation 1328 (e.g., glue/dam) may be straight and may also be angled or curved.

FIG. 13F illustrates the flow cell 1300 after formation of a fluidic flow channel 1392 in the fluidics flow channel portion 1311 (which can also be understood as a fluidics cavity portion) of the cavity 1309 which was not filled with material when the connections were encapsulated, as the wire-bonding encapsulation portion 1324 is only on the side. The fluidic flow channel 1392 is formed over the active surface 1310 of the die (sensor structure 1342), by attaching a lid 1390 to portions of the carrier 1396 adjacent to the fan-out regions 1380 and/or the top surface of the encapsulation 1328, to form the fluidic flow channel between the active surface 1310 and the lid 1390. For example, an adhesive is applied to the lid 1390 and the carrier 1396, at an upper surface of each wall 1303 of the carrier 1390. Adhesive forms an interface between an upper surface of each wall 1303 of the carrier 1390 or the top surface of the encapsulation 1328, and the lid 1390.

Figures 14A, 14B, 14C:
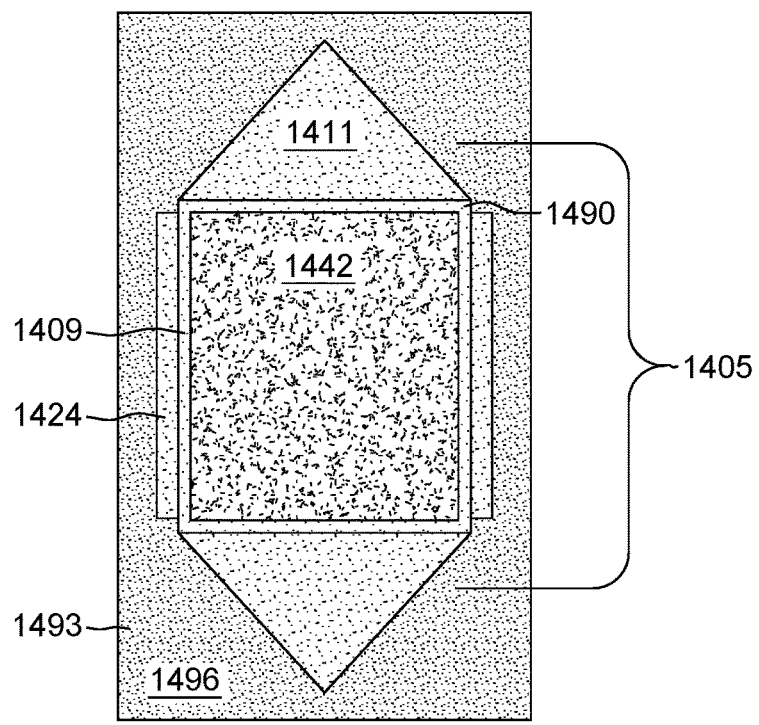
FIGS. 14A-14C depict various views of an example of a flow cell manufactured utilizing the methods illustrated by FIG. 5 and FIGS. 13A-13F.

FIG. 14A is a top view of the flow cell 1400 formed utilizing the method illustrated in FIGS. 13A-13F. This can also be understood as a top view of the flow cell 1300 in FIG. 13F. As seen from this view, sensor structure 1442 is visible through a translucent lid 1490. The sensor structure 1442 is positioned in the sensor structure cavity portion 1409 (which can also be understood as a die cavity portion) of a cavity 1405. The fluidics flow channel portion 1411 (which can also be understood as a fluidics cavity portion) of the cavity 1405 is also illustrated. As illustrated in different parts in FIGS. 14A, 14B, and 14C, the fluidics flow channel portion 1411 extends, at different points, as bounded by the encapsulation 1428 (encapsulating the bond pads 1437 the on the die), on two side, and the walls 1403 on the other sides, defining the (micro)-fluidic flow channel 1492. The walls 1403 are varying horizontal distances from the sensor structure cavity portion 1409 housing the sensor structure 1442. In this example, the shape is a triangle on either side of the sensor structure cavity portion 1409. FIG. 14B is a horizontal cross sectional view of the flow cell 1400, portions of which are described in the discussion of FIG. 13F.

FIG. 14C is a vertical cross sectional view of the flow cell 1400. From this point of view, fluidics holes 1467, providing an inlet and/or an outlet for the fluid in the (micro)-fluidic flow channel 1492 are visible in the lid 1490. As may be appreciated, the (micro)-fluidic flow channel 1492 can change in shape using the shape and orientation of the cavity 1405 in the carrier 1496. As it apparent from contrasting the views of 14C and 13F, while the (micro)-fluidic flow channel 1492 is bounded of two sides by portions of the encapsulation 1428, it is also bounded by the walls 1403 that bound the fluidics flow channel portion 1411, on two other sides.

FIGS. 15A-17C illustrate, in more detail, examples of various aspects of the formation of the flow cell 400 of FIG. 4. These carriers formed with the methods discussed below do not utilize TSVs to provide electrical and/or thermal conductivity. Thus, certain differences exist in the carrier in order to accommodate this difference in the electrical connectivity structure.

Figure 15A:
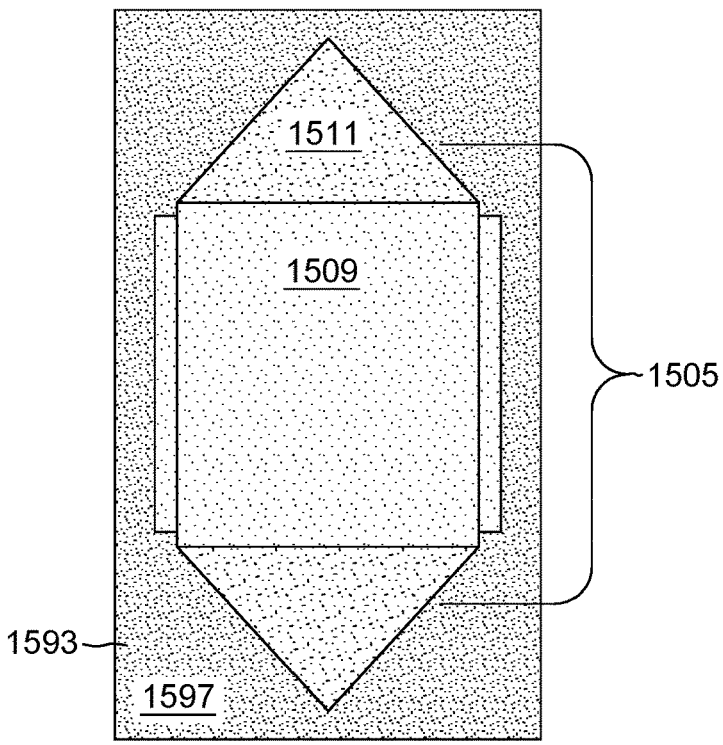
FIGS. 15A-15C depict, in one example, various views of a substrate with one or more pre-engineered cavities such that the substrate can be utilized in a method of manufacturing the flow cell of FIG. 4.
Figure 15B:
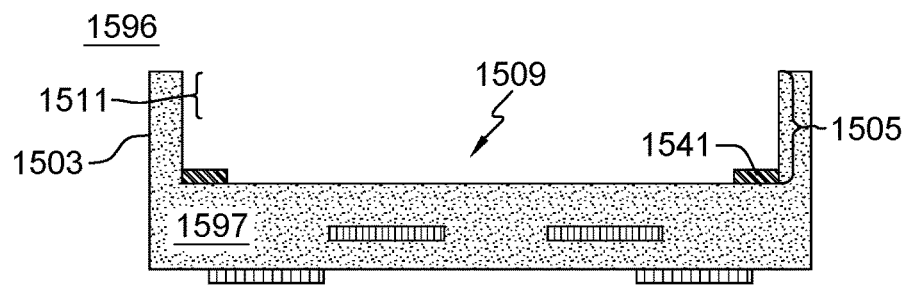
Figure 15C:
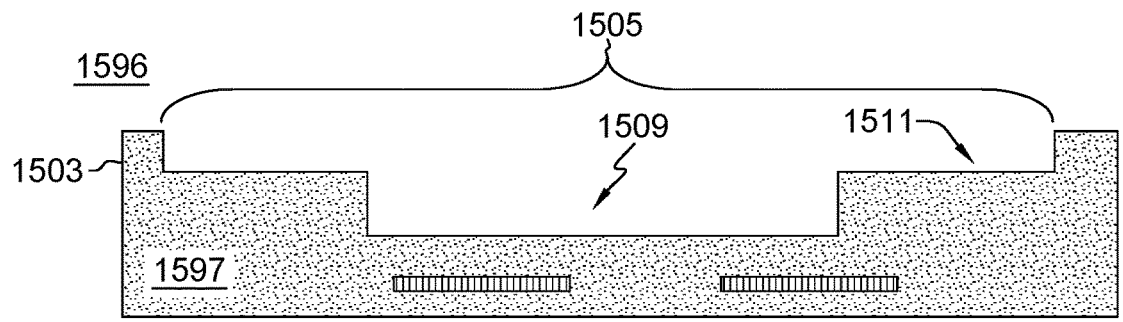

FIG. 15A is a top view of the carrier 496, 1596 also depicted in FIG. 4, which includes a substrate 497. FIG. 15B is a horizontal cross section of the same and FIG. 15C is a vertical cross section of the same. The carrier 1596, which includes a substrate 1597, can be understood to have four (4) levels, when the cavity 1505 is taken into account. The substrate 1597 may be comprises of a PCB and/or a ceramic circuit board. One section of the cavity 1505, the sensor structure cavity portion 1509 (which can also be understood as a die cavity portion), is approximately, and in some instances exactly, the vertical height of the active surface of the sensor structure (this height is a height after a pick and place of the sensor structure on the under-fill layer, in the cavity 1505+/−standard tolerances; a non-limiting example of a standard tolerance may be about +/−1-10 um). A second section, a fluidics flow channel portion 1511 (which can also be understood as a fluidics cavity portion), has a depth that begins at the top of the sensor structure cavity portion 1509 and defines a height of the eventual fluidics flow channel portion of the flow cell 400 (FIG. 4) e.g., about 100 um). The cavity 1505 is bounded by walls 1503, which are the highest points of the carrier 1596. For example, it is at the top surface of the walls 1503 that the carrier 1596 interfaces with a lid. However, the lid also interfaces with portions of the encapsulated electrical connection. To create this interface, as will be explained herein, an interface may be applied to the top surface of the walls 1503 and well as a portion of the encapsulation of the electrical connections.

FIG. 15B is a horizontal cross sectional view of the carrier 1596 of FIG. 15A. This view illustrates the electrical contacts, the topside substrate bond pads 1541, which are located in the sensor structure cavity portion 1509. The fluidics flow channel portion 1511 is not visible from this vantage point. The sensor structure 442 (FIG. 4) is electrically coupled to these topside substrate bond pads 1541, via wire bonds 431 (FIG. 4) from electrical contacts (e.g., bond pads 437 the on the die (FIG. 4)) of the sensor structure 442 (FIG. 4). In this view, a differential in heights of the sensor structure cavity portion 1509 and the walls 1503 is visible. In order to potentially enhance thermal performance, thermal vias may be integrated into the carrier 1596.

FIG. 15C is a vertical cross sectional view of the carrier 1596. From this vantage point, the differentials in vertical height between the sensor structure cavity portion 1509, the fluidics flow channel portion 1511, and the walls 1503, bounding the entirety of the cavity 1505, are more visible.

Figure 16A:
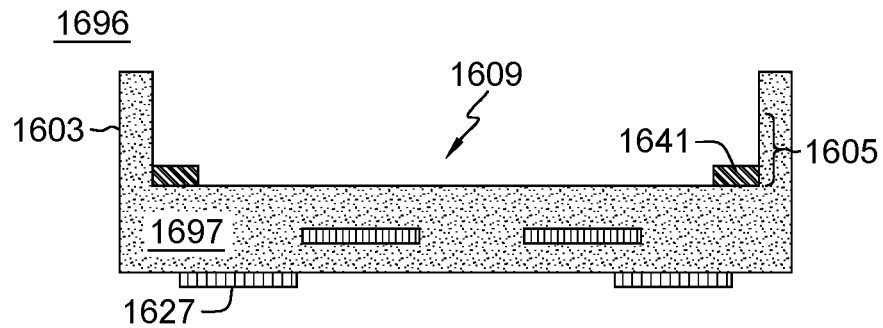
FIGS. 16A-16F depict, in one example, a cross section of the substrate of FIGS. 15A-15C, at different points of a process for manufacturing the flow cell of FIG. 4.

FIGS. 16A-16E illustrate certain aspects of a method for forming the flow cell 400 of FIG. 4. FIG. 16A is another cross sectional view of carrier 1596 of FIG. 15A. Although not as visually obvious as in FIG. 15A (because the horizontal distance of the walls 1503 from the sensor structure cavity portion 1509 throughout the wire-bonding encapsulation portion 1524, vary), FIG. 16A depicts carrier 1696 (similar to carrier 1596), which includes the sensor structure cavity portion 1609 (which can also be understood as a die cavity portion), the fluidics flow channel portion 1611 (which can also be understood as a fluidics cavity portion), and the walls 1603. The carrier 1696 comprises a substrate and may be formed from materials including, but not limited to a printed circuit board (PCB) and/or a ceramic circuit board. Electrical contacts on the substrate comprise topside substrate bond pads 1641, which are situated at a lowest vertical height (a base surface) of the sensor structure cavity portion 1609, on the carrier 1696, such that they can be electrically coupled to the sensor structure (not pictured), and that the sensor structure can be centered in the sensor structure cavity portion 1609, relative to these topside substrate bond pads 1641. Not pictured are connections between layers of the substrate 1697 (e.g., additional metal layers of substrate/PCB with via connections between layers that are not shown) which comprise internal electrical lines which to route signal from the bottom the bond pads 1641 to the back of the carrier 1627.

Figure 16B:
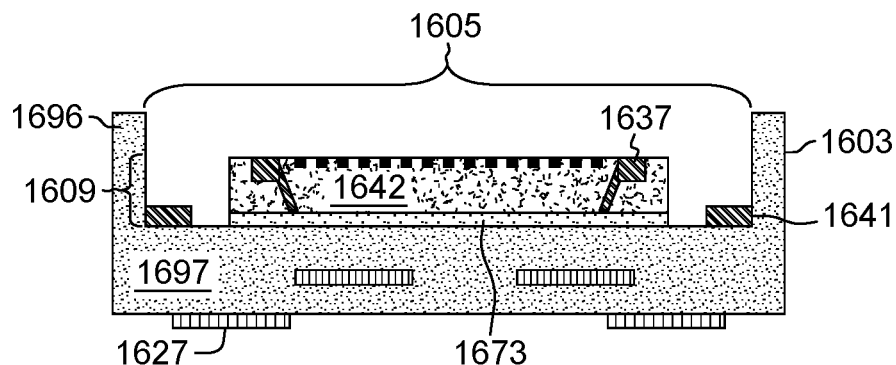

Referring to FIG. 16B, as illustrated herein, a die, a sensor structure 1642, is picked and placed in the sensor structure cavity portion 1609. The die or sensor structure 1642, in this example, is singulated. In some examples, certain portion(s) of the die or sensor structure is coated with a polymeric material. The polymeric material may be, for example, a gel-based material, such as a polyacrylamide gel coating, including, for example, poly(N-(5-azidoacetamidylpentyl) acrylamide-co-acrylamide-co-acrylonitrile) ("PAZAM"). In one example, the die or sensor structure includes at least one nanowell at the surface, and the coating is present at the bottom and/or sidewall portions of the nanowell. After the coating is applied, at least a portion of the coating is polished. The die or sensor structure 1642 may be coated before or after assembly with the carrier 1696. In one example, the die or sensor structure 1642 is coated before assembly with the carrier 1696. FIG. 16B also illustrates formation of an under-fill 1673 layer, which can be accomplished by dispensing a given volume of under-fill material, as discussed in reference to FIGS. 7 and 11. As discussed earlier, in the illustrated examples herein, the under-fill 1673 provides an interface between the sensor structure 1642 and the substrate 1697.

Figure 16C:
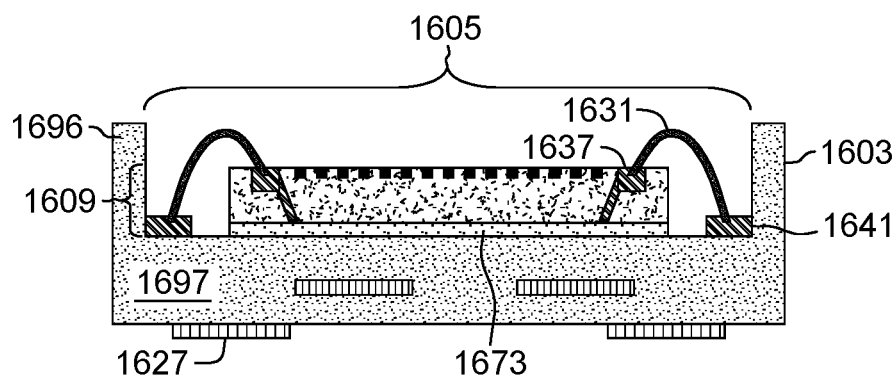

FIG. 16C illustrates wire-bonding the topside substrate bond pads 1641 to the pads on the carrier 1637, in the sensor structure cavity portion 1609. The wire bonds may be composed of one or more metals, such as aluminum, copper, silver, gold, or any combination thereof. The metals in the wire bonds may be in elemental form, alloy form, or a composite form. For example, the wire bonding may comprise, for example, forming a eutectic metal bond.

Figure 16D:
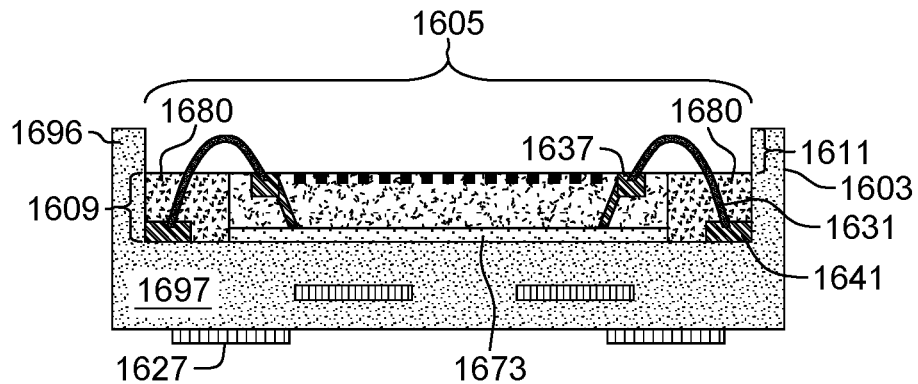

In FIG. 16D, a fan-out region 1680 is formed by depositing a curable material to fill a remainder of sensor structure cavity portion 1609 (e.g., unfilled spaces on either side of the sensor structure 1642) and encapsulating part of the connections. Because portions of the carrier 1696 bound the sensor structure cavity portion 1609, the curable material comprising the fan-out region 1680 can be dispensed without any molding structure. The curable material may include, but is not limited to, epoxy and/or glue. Methods of curing this material may include, but are not limited to, one or more of ultraviolet exposure and/or thermal exposure. The curable material is dispensed such that the resulting fan-out region 1680 is at least comparable in height to the active surface 1610 of the sensor structure 1642. The fan-out region 1680 does not extend into the fluidics flow channel portion 1611 of the cavity 1609.

Figure 16E:
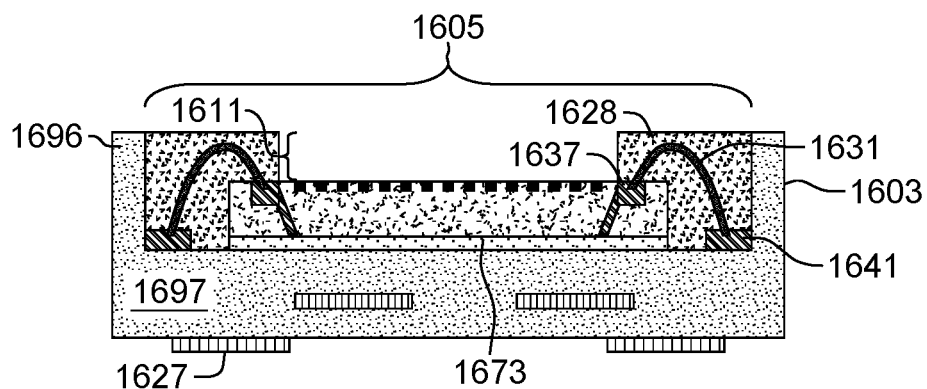
Figure 16F:
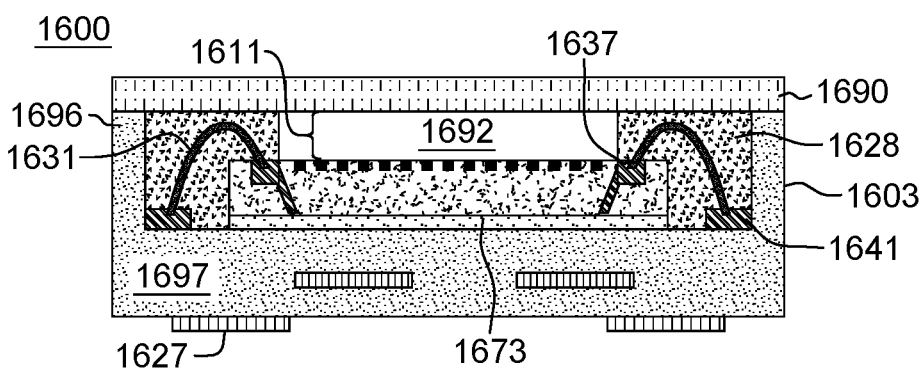

FIG. 16E illustrates encapsulating the remainder of the wire-bonded connection (forming the encapsulation of the connection 1628). One or more pin may be utilized to ensure that the material used for encapsulation 1628 (e.g., a curable material, which may be the same material used to form the fan-out regions 1680), does not flow onto the active surface 1610 of the sensor structure 1642. The top surface of the encapsulation 1628 (e.g., glue, epoxy) may not be flat initially and may be flattened when placing the glass lid, as illustrated in FIG. 16F. The encapsulation 1628, in part, bounds the fluidic flow channel and thus, the shape of side walls of the encapsulation 1628 can contribute to the utility of the flow cell. For example, the walls of the encapsulation 1628 (e.g., glue/dam) may be straight and may also be angled or curved.

FIG. 16F illustrates the flow cell 1600 after formation of a fluidic flow channel 1692 in the fluidics flow channel portion 1611 of the cavity 1609 which was not filled with material when the connections were encapsulated. The fluidic flow channel 1692 is formed over the active surface 1610 of the die (sensor structure 1642), by attaching a lid 1690 to portions of the carrier 1696 adjacent to the fan-out regions 1680 and/or the top surface of the encapsulation 1628, to form the fluidic flow channel between the active surface 1610 and the lid 1690. For example, an adhesive is applied to the lid 1690 and the carrier 1696, at an upper surface of each wall 1603 of the carrier 1690. Adhesive forms an interface between an upper surface of each wall 1603 of the carrier 1690 or the top surface of the encapsulation 1628, and the lid 1690.

Figure 17A:
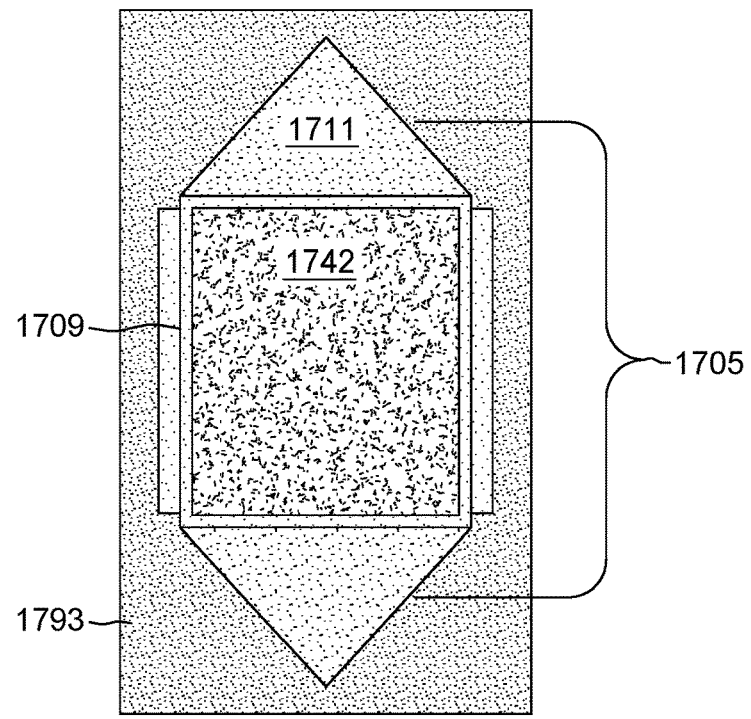
FIGS. 17A-17C depict, in one example, various views of an example of a flow cell manufactured utilizing the methods illustrated by FIG. 5 and FIGS. 16A-16F.
Figure 17B:
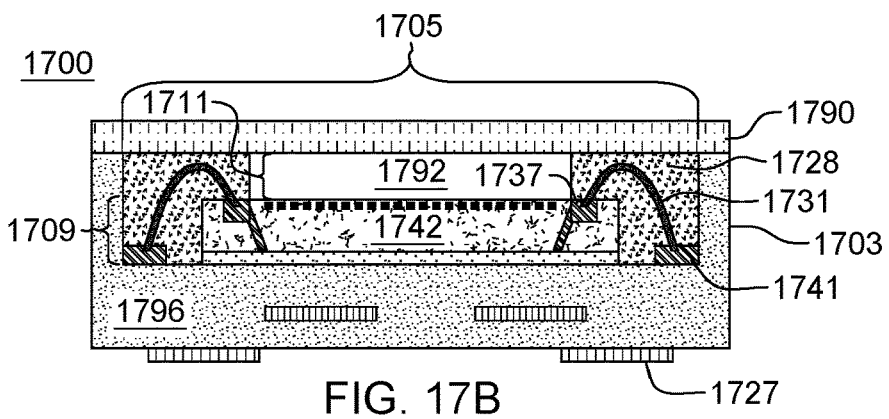

FIG. 17A is a top view of the flow cell 1700 formed utilizing the method illustrated in FIGS. 16A-16F. This can also be understood as a top view of the flow cell 1600 in FIG. 16F. As seen from this view, sensor structure 1742 is visible through a translucent lid 1790. The sensor structure 1742 is positioned in the sensor structure cavity portion 1709 (which can also be understood as a die cavity portion). The fluidics flow channel portion 1711 (which can also be understood as a fluidics cavity portion) is also illustrated. As illustrated in FIG. 17A, the fluidics flow channel portion 1711 extends, at different points, as bounded by the encapsulation 1728, varying horizontal distances from the sensor structure cavity portion 1709 housing the sensor structure 1742. In this example, the shape is a triangle on either side of the sensor structure cavity portion 1709. FIG. 17B is a horizontal cross sectional view of the flow cell 1700, portions of which are described in the discussion of FIG. 16E.

Figure 17C:
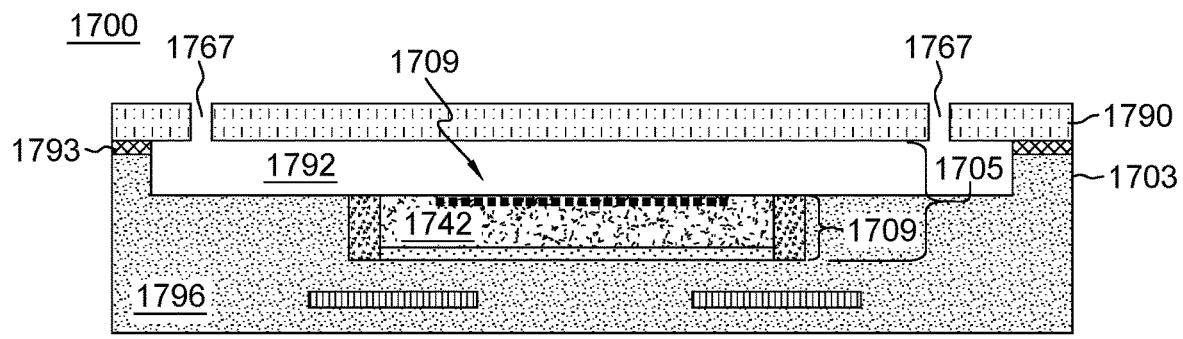

FIG. 17C is a vertical cross sectional view of the flow cell 1700. From this point of view, fluidics holes 1767, providing an inlet and/or an outlet for the fluid in the (micro)-fluidic flow channel 1792 are visible in the lid 1790. As will be appreciated, the (micro)-fluidic flow channel 1792 can change in shape based on the shape and orientation of the cavity 1705 in the carrier 1796. As is apparent from contrasting the views of 17B and 17C, while the (micro)-fluidic flow channel 1792 is bounded of two sides by portions of the encapsulation 1728, it is also bounded by the walls 1703 that bound the fluidics flow channel portion 1711, on two other sides.

Figure 18A:
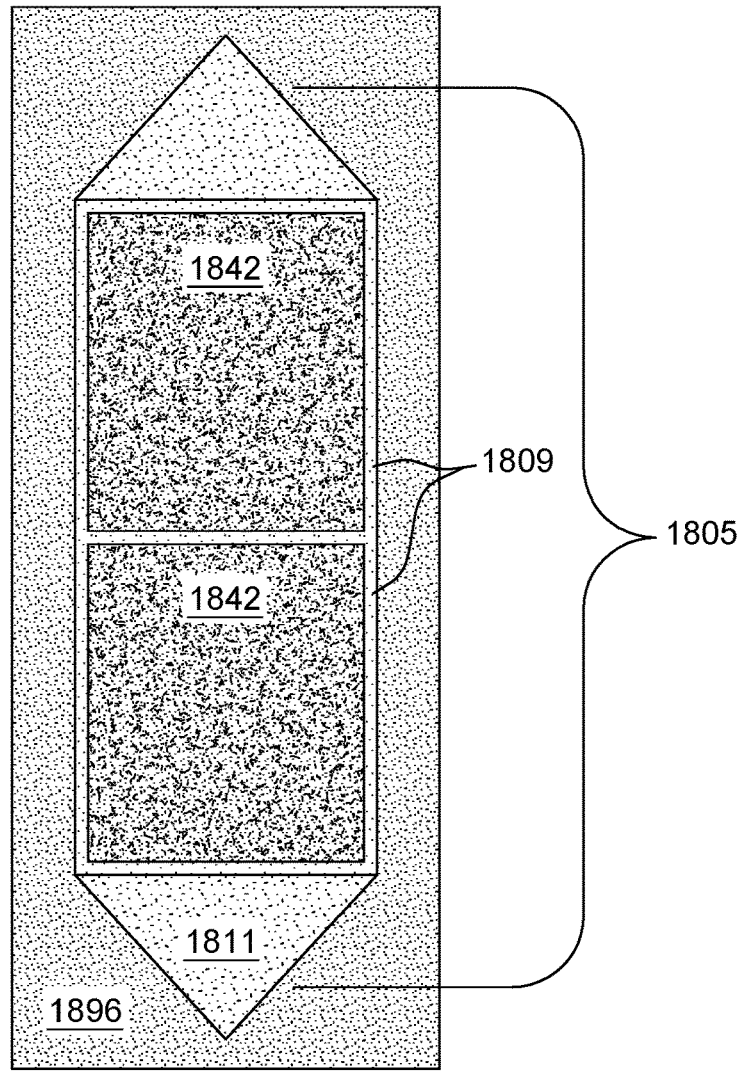
FIGS. 18A-18C depict various views of an example of a flow cell where a carrier that includes a substrate includes cavities to accommodate multiple silicon CMOS sensors, separately.
Figure 18B:
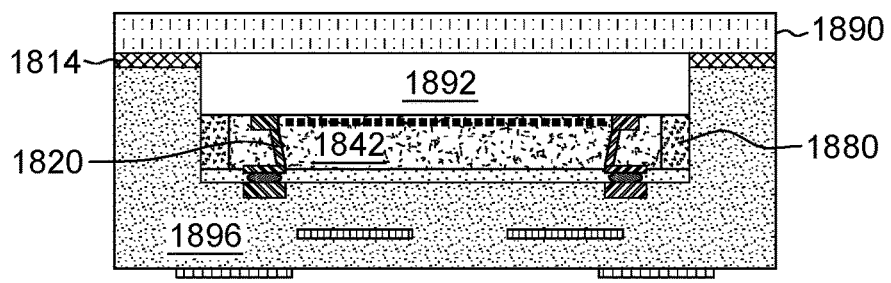
Figure 18C:
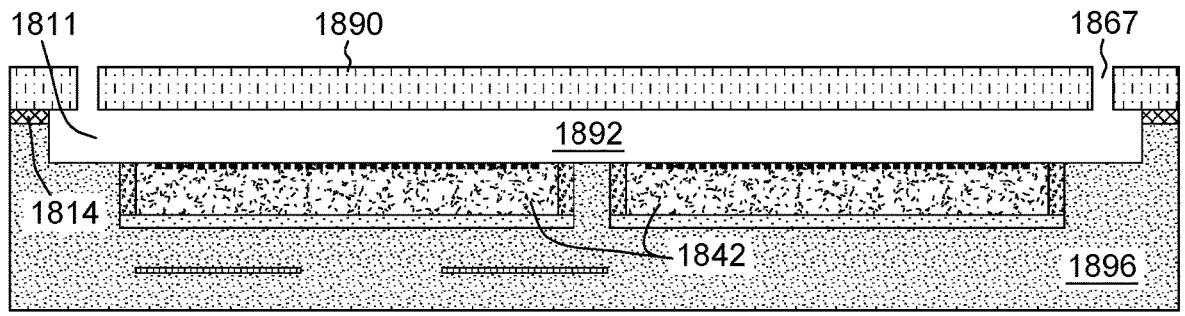

Many of the examples illustrated thus far illustrate a flow cell that may include a single die. However, certain flow cells may include more than one die, each situated in a separate cavity and/or portion of a cavity in a carrier that includes a substrate. FIGS. 18A-18C illustrate some aspects of examples with multiple sensor structures. FIG. 18A is a top view of a flow cell 1800 formed with a carrier 1896 with more than one cavity 1805. FIG. 18B is a horizontal cross sectional view of the flow cell 1800 while FIG. 18C is a vertical cross sectional view of the flow cell 1800. The illustrated example has two cavities 1805, but additional examples may or may not have more than two cavities 1805. In examples with multiple cavities in the substrate, the cavities are along the same plane, as illustrated in FIGS. 18A-18C. From the top view of FIG. 18A, the two cavities 1805 in this particular example are both along the same plane. As seen in both the top perspective of FIG. 18A and the vertical cross sectional view of FIG. 18C, two sensor structures 1842 are placed (e.g., using a pick and place procedure), into cavities 1805 in the carrier 1896. The carrier 1896 includes a sensor structure cavity portion 1809 (which can also be understood as a die cavity portion), which accommodates both sensor structures 1842, as well as fan-out regions 1880 formed in each cavity portion 1809 which accommodates a sensor structure 1842. The carrier 1896 also includes a fluidics flow channel portion 1811 (which can also be understood as a fluidics cavity portion, where a (micro)-fluidic flow channel 1892 is formed). The example illustrated in FIGS. 18A-C includes TSVs 1820 in for electrical properties, but examples that utilize bond pads could also be integrated into a carrier 1896 with this type of cavities. Additionally, although FIGS. 18A-18C the lid 1890 is attached at an interface with the top surface of the walls 1814 of the cavities, but in a spacer may also form this interface with the lid. The lid 1890 includes fluidics holes 1867.

Figure 19:
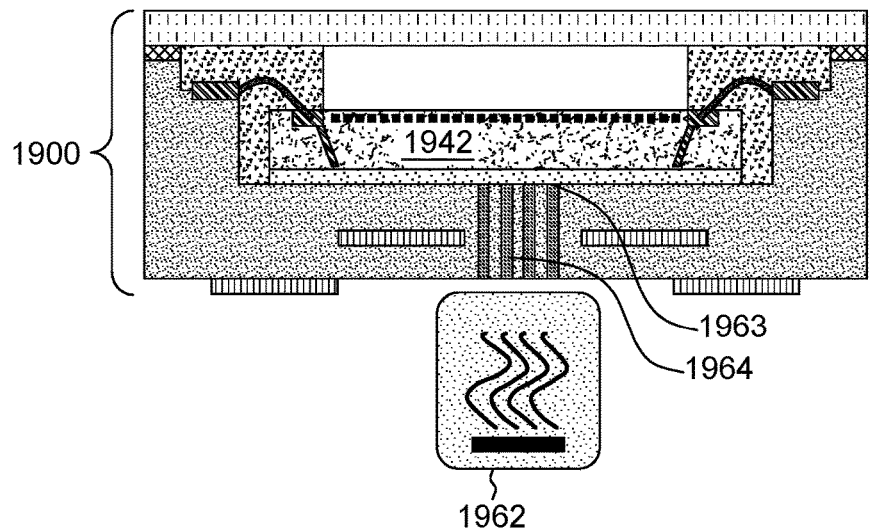
FIG. 19 depicts an example of a flow cell where thermal management is accomplished through the addition of thermal vias.
Figure 20A:
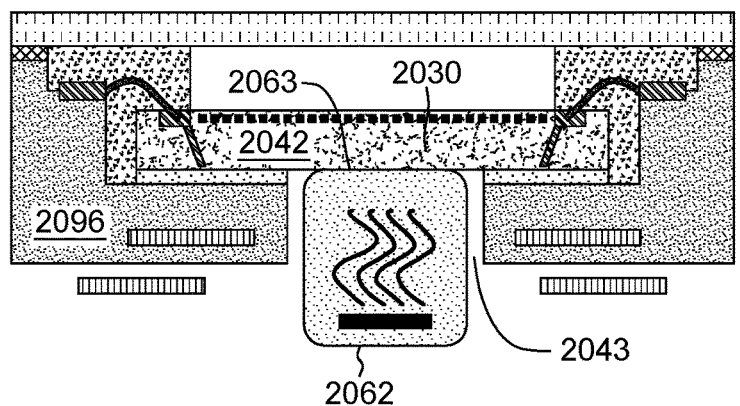
FIGS. 20A-20B depicts examples of flow cells where thermal management is accomplished through the addition of a through cut to a substrate or an additional cavity in the substrate.
Figure 20B:
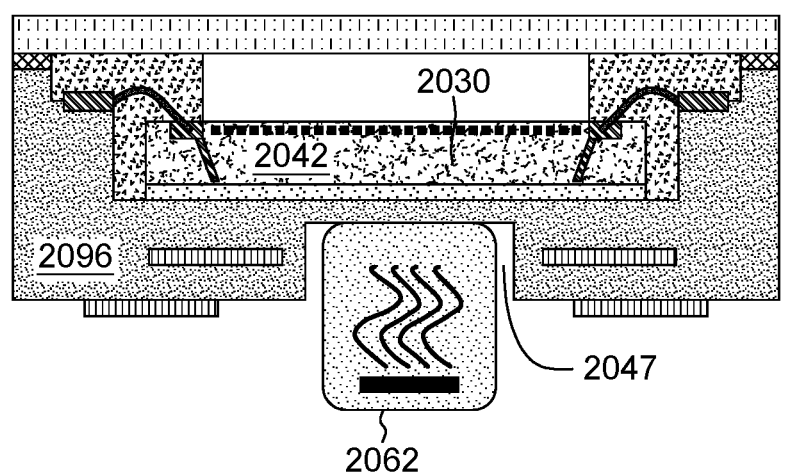

As aforementioned, the flow cells described and illustrated herein enable thermal transfer from the silicon wafer (e.g., CMOS). This aspect may or may not be enhanced through the addition of thermal vias 1964 (e.g., made of copper) for thermal management, in particular, to access the die (e.g., CMOS) directly for heating, with a heating element 1962, as depicted in FIG. 19. Thermal transfer from the silicon wafer may or may not also be enabled as depicted in FIGS. 20A-20B, without the thermal vias 1964 (FIG. 19), where structural changes enable contact with the backside surface 2063 of a silicon wafer die 2030 in the sensor structure 2042 of the flow cell 2000. In FIG. 20A, a through cut 2043 is implemented to couple the heating element 2062 to a backside surface 2063 of a silicon wafer die 2030 in the sensor structure 2042 of the flow cell 2000. In FIG. 20B, the carrier 2096 includes a thermal vias cavity 2047, so the heating element 2062 may be coupled to the backside surface 2063 based in being inserted into the thermal vias cavity 2047.

In some examples of the method described herein, the method comprises placing a die in a portion of a cavity in a substrate, where one or more electrical contacts are accessible on a surface of the die. In some examples, the substrate comprises exposed electrical contacts accessible to the electrical contacts on the surface of the die. The placing may include defining a first space in the cavity adjacent to a first edge of the upper surface of the die and a second space in the cavity adjacent to the second edge of the upper surface of the die. The method may also include forming an underfill layer in the cavity between the lower surface of the die and the substrate. The method may include forming fluidics fan-out regions by depositing a curable material in the first space and the second space to form the fluidics fan-out regions, a surface of the fluidics fan-out regions being contiguous with the upper surface of the die. The method may include forming a fluidic flow channel over the active surface of the die, comprising: attaching a lid to portions of the substrate adjacent to the fluidics fan-out regions to form the fluidic flow channel between the active surface and the lid.

In some examples of the method, the placing further comprises coupling the exposed electrical contacts to the electrical contacts.

In some examples, the method also comprises coupling the exposed electrical contacts to the electrical contacts on the surface of the die.

In some examples of the method, the exposed electrical contacts and the electrical contacts on the surface of the die comprise bonding pads, the bonding pads comprising the exposed electrical contacts are each oriented in one of the first space or the second space, and the coupling comprises wire-bonding each exposed electrical contact of the exposed electrical contacts, to one of the electrical contacts on the surface of the die, forming wire-bonded connections.

In some examples, the method also comprises prior to forming the fluidic flow channel, encapsulating the wire-bonded connections by depositing the curable material over the fluidics fan-out regions.

In some examples, forming the fluidic flow channel over the active surface of the die, further comprises: orienting the lid to be in physical contact with a top surface of each of the encapsulated wire-bonded connections, wherein the orienting flattens each top surface.

In some examples of the method, the die further comprising a silicon wafer, a passivation stack, and one or more through silicon vias extended through a portion of the silicon wafer and the passivation stack, wherein the passivation stack is disposed below a lower surface of the portion of the silicon wafer, wherein a portion of each of the one or more through silicon vias is exposed through an opening of one or more openings in the passivation stack, and wherein each exposed portion is coupled to the electrical contacts.

In some examples, placing further comprises coupling the exposed electrical contacts to the electrical contacts.

In some examples, the method further comprises coupling the exposed electrical contacts to the electrical contacts on the surface of the die.

In some examples, the coupling comprises utilizing a method selected from the group consisting of: reflowing the electrical contacts, wherein the electrical contacts of the die comprise pillar bumps, and utilizing an anisotropic conductive films to couple the electrical contacts to the exposed electrical contacts.

In some examples of the method, the curable material is selected from the group consisting of epoxy and glue.

In some examples of the method, forming fluidics fan-out regions further comprises curing the curable material.

In some examples, the curing comprises utilizing a method selected from the group consisting of: exposing the curable material to ultraviolet radiation and exposing the curable material to thermal energy.

In some examples of the method, the die comprises a sensor.

In some examples of the method, the sensor comprises a Complementary Metal-Oxide-Semiconductor (CMOS) detection device.

In some examples of the method, the cavity comprises: a die cavity portion, a fluidics cavity portion, and a top level portion, where the die cavity portion and the under-fill layer, together, are substantially equal in height to the die, where the fluidics cavity portion comprises a space comprising a height of the fluidic flow channel, and where the top level portion comprises a height of the portions of the substrate adjacent to the fluidics fan-out regions.

In some examples, placing the die in the portion of a cavity in a substrate comprises placing the die in the die cavity portion of the substrate.

In some examples of the method, the portions of the substrate adjacent to the fluidics fan-out regions comprise portions of a circuit board, and the top level portion comprises an interface between the circuit board and the lid.

In some examples of the method, the lid comprises an inlet for fluids and an outlet for fluid.

In some examples, attaching the lid comprises applying an adhesive between the circuit board and the lid.

In some examples of the method, the die is singulated from a silicon wafer.

In some examples of the method, the surface of the die is selected from the group consisting of: an upper surface of the die, a portion of the upper surface of the die comprising an active surface, and a lower surface parallel to the upper surface.

In some examples of the apparatus described herein, the apparatus comprises: a die, where one or more electrical contacts are accessible on a surface of the die. The apparatus may also include a substrate comprising a cavity, where the die is oriented in a portion of the cavity in the substrate, where the substrate comprises exposed electrical contacts electrically coupled to the electrical contacts on the surface of the die, where the orientation defines a first space in the cavity adjacent to a first edge of the upper surface of the die and a second space in the cavity adjacent to the second edge of the upper surface of the die. The apparatus may also include fluidics fan-out regions comprising a first cured material deposited in the first space and the second space, a surface of the fluidics fan-out regions being contiguous with the upper surface of the die.

In some example of the apparatus, the apparatus may also include a fluidic flow channel over the active surface of the die defined by the surface of the fluidics fan-out regions and the upper surface of the die and a lid attached to portions of the substrate adjacent to the fluidics fan-out regions.

In some examples of the apparatus, the apparatus further comprises an under-fill layer in the cavity between the lower surface of the die and the substrate.

In some examples of the apparatus, the die is singulated from a silicon wafer.

In some examples of the apparatus, the exposed electrical contacts comprise substrate bonding pads and the electrical contacts on the surface of the die comprise die bonding pads, and wherein each die bonding pad is coupled to at least one substrate bonding pad with a wire, forming wire-bonded connections.

In some examples of the apparatus, the wire-bonded connections are encapsulated in a second cured material.

In some examples of the apparatus, the apparatus also includes a fluidic flow channel over the active surface of the die defined by the surface of the fluidics fan-out regions and the upper surface of the die and a lid attached to portions of the substrate adjacent to the fluidics fan-out regions, and the lid is oriented to be in physical contact with a top surface of each of the encapsulated wire-bonded connections.

In some examples, the die further comprising a silicon wafer, a passivation stack, and one or more through silicon vias extended through a portion of the silicon wafer and the passivation stack, wherein the passivation stack is disposed below a lower surface of the portion of the silicon wafer, wherein a portion of each of the one or more through silicon vias is exposed through an opening of one or more openings in the passivation stack, and wherein each exposed portion is coupled to the electrical contacts.

In some examples, each of the cured material and the second cured material are selected from the group consisting of: epoxy and glue.

In some examples, the die comprises a sensor.

In some examples, the sensor comprises a Complementary Metal-Oxide-Semiconductor (CMOS) detection device.

In some examples of the apparatus, the apparatus includes an under-fill layer in the cavity between the lower surface of the die and the substrate, and the cavity comprises: a die cavity portion, a fluidics cavity portion, and a top level portion, where the die cavity portion and the under-fill layer, together, are substantially equal in height to the die, where the fluidics cavity portion comprises a space comprising a height of the fluidic flow channel, and where the top level portion comprises a height of the portions of the substrate adjacent to the fluidics fan-out regions.

In some examples, the portion of the cavity in the substrate in which the die is oriented comprises the die cavity portion.

In some examples, the portions of the substrate adjacent to the fluidics fan-out regions comprise portions of a circuit board, and the top level portion comprises an interface between the circuit board and the lid.

In some examples, the lid comprises an inlet for fluids and an outlet for fluid.

In some examples, the fluidic flow channel is approximately 100 um from the active surface to the lid.

In some examples, the circuit board is selected from the group consisting of: a printed circuit board and a ceramic circuit board.

In some examples, the surface is selected from the group consisting of: an upper surface of the die, a portion of the upper surface of the die comprising an active surface, and a lower surface parallel to the upper surface.

In some examples of the method described herein, the method includes picking and placing a die comprising a sensor and one or more electrical contacts accessible on a surface of the die on a cavity surface at a base of a cavity of a carrier, where the carrier comprises a substrate and the cavity, where the substrate comprises exposed electrical contacts, and where the placing defines a first space in the cavity adjacent to a first edge of the surface of the die and a second space in the cavity adjacent to a second edge of the surface of the die. The method may also include connecting each of the one or more electrical contacts of the die to at least one of the exposed electrical contacts of the substrate. The method may include forming fluidics fan-out regions by depositing a curable material in the first space and the second space to form the fluidics fan-out regions. The method may include attaching a lid to portions of the substrate adjacent to the fluidics fan-out regions to form a fluidic flow channel between an active surface of the sensor and the lid.

In some examples of the method, the cavity surface comprises an under-fill layer.

In some examples of the apparatus described herein, the apparatus comprises a die and a substrate comprising a cavity. In some examples, the die is oriented in a portion of the cavity in the substrate, where the orientation defines a first space in the cavity adjacent to a first edge of the upper surface of the die and a second space in the cavity adjacent to the second edge of the upper surface of the die. The apparatus may also include fluidics fan-out regions comprising a first cured material deposited in the first space and the second space, a surface of the fluidics fan-out regions being contiguous with the upper surface of the die. The apparatus may also include a fluidic flow channel over the active surface of the die defined by the surface of the fluidics fan-out regions and the upper surface of the die and a lid attached to portions of the substrate adjacent to the fluidics fan-out regions.

The flowchart and block diagrams in the Figures illustrate the architecture, functionality, and operation of possible implementations of systems, methods, and computer program products according to various examples of the present implementation. In this regard, each block in the flowchart or block diagrams can represent a module, segment, or portion of instructions, which comprises one or more executable instructions for implementing the specified logical function(s). In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular examples only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, processes, operations, elements, and/or components, but do not preclude the presence or addition of one or more other features, integers, steps, processes, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more examples has been presented for purposes of illustration and description, but is not intended to be exhaustive or limited to in the form disclosed. Many modifications and variations will be apparent to those of ordinary skill in the art. The example was chosen and described in order to best explain various aspects and the practical application, and to enable others of ordinary skill in the art to understand various examples with various modifications as are suited to the particular use contemplated.

It should be appreciated that all combinations of the foregoing concepts and additional concepts discussed in greater detail below (provided such concepts are not mutually inconsistent) are contemplated as being part of the subject matter disclosed herein at least to achieve the benefits as described herein. In particular, all combinations of claims subject matter appearing at the end of this disclosure are contemplated as being part of the subject matter disclosed herein. It should also be appreciated that terminology explicitly employed herein that also may appear in any disclosure incorporated by reference should be accorded a meaning most consistent with the particular concepts disclosed herein.

This written description uses examples to disclose the subject matter, and also to enable any person skilled in the art to practice the subject matter, including making and using any devices or systems and performing any incorporated methods. The patentable scope of the subject matter is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

It is to be understood that the above description is intended to be illustrative, and not restrictive. For example, the above-described examples (and/or aspects thereof) may be used in combination with each other. In addition, many modifications may be made to adapt a particular situation or material to the teachings of the various examples without departing from their scope. While the dimensions and types of materials described herein are intended to define the parameters of the various examples, they are by no means limiting and are merely provided by way of example. Many other examples will be apparent to those of skill in the art upon reviewing the above description. The scope of the various examples should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Forms of term "based on" herein encompass relationships where an element is partially based on as well as relationships where an element is entirely based on. Forms of the term "defined" encompass relationships where an element is partially defined as well as relationships where an element is entirely defined. Further, the limitations of the following claims are not written in means-plus-function format and are not intended to be interpreted based on 35 U.S.C. § 112, sixth paragraph, unless and until such claim limitations expressly use the phrase "means for" followed by a statement of function void of further structure. It is to be understood that not necessarily all such objects or advantages described above may be achieved in accordance with any particular example. Thus, for example, those skilled in the art will recognize that the systems and techniques described herein may be embodied or carried out in a manner that achieves or optimizes one advantage or group of advantages as taught herein without necessarily achieving other objects or advantages as may be taught or suggested herein.

While the subject matter has been described in detail in connection with only a limited number of examples, it should be readily understood that the subject matter is not limited to such disclosed examples. Rather, the subject matter can be modified to incorporate any number of variations, alterations, substitutions or equivalent arrangements not heretofore described, but which are commensurate with the spirit and scope of the subject matter. Additionally, while various examples of the subject matter have been described, it is to be understood that aspects of the disclosure may include only some of the described examples. Also, while some examples are described as having a certain number of elements it will be understood that the subject matter can be practiced with less than or greater than the certain number of elements. Accordingly, the subject matter is not to be seen as limited by the foregoing description, but is only limited by the scope of the appended claims.

What is claimed is:

1. A method comprising:
   placing a die in a portion of a cavity in a substrate, wherein one or more electrical contacts are accessible on a surface of the die, wherein the substrate comprises exposed electrical contacts accessible to the electrical contacts on the surface of the die, wherein the placing defines a first space in the cavity adjacent to a first edge of an upper surface of the die and a second space in the cavity adjacent to the second edge of the upper surface of the die;
   depositing a curable material in the first space and the second space to form fluidics fan-out regions, a surface of the fluidics fan-out regions being contiguous with the upper surface of the die;
   attaching a lid to portions of the substrate adjacent to the fluidics fan-out regions to form a fluidic flow channel between the upper surface of the die and the lid; and
   coupling the exposed electrical contacts to the electrical contacts on the surface of the die
   wherein the exposed electrical contacts and the electrical contacts on the surface of the die comprise bonding pads, wherein the bonding pads of the exposed electrical contacts are each oriented in one of the first space or the second space, and wherein the coupling comprises wire-bonding each exposed electrical contact of the exposed electrical contacts, to one of the electrical contacts on the surface of the die, forming wire-bonded connection.

2. The method of claim 1, further comprising:
   prior to forming the fluidic flow channel, encapsulating the wire-bonded connections by depositing the curable material over the fluidics fan-out regions.

3. The method of claim 2, wherein forming the fluidic flow channel over the upper surface of the die, further comprises:
   orienting the lid to be in physical contact with a top surface of each of the encapsulated wire-bonded connections, wherein the orienting flattens each top surface.

4. The method of claim 1, the die further comprising a silicon wafer, a passivation stack, and one or more through silicon vias extended through a portion of the silicon wafer and the passivation stack, wherein the passivation stack is disposed below a lower surface of the portion of the silicon wafer, wherein a portion of each of the one or more through silicon vias is exposed through an opening of one or more openings in the passivation stack, and wherein each exposed portion is coupled to the electrical contacts.

5. The method of claim 1, wherein the upper surface of the die comprises an active surface.

6. The method of claim 1, wherein the curable material is selected from the group consisting of epoxy and glue.

7. The method of claim 1, wherein the die comprises a Complementary Metal-Oxide-Semiconductor (CMOS) detection device.

8. An apparatus comprising:
   a die, wherein one or more electrical contacts are accessible on a surface of the die;
   a substrate comprising a cavity, wherein the die is oriented in a portion of the cavity in the substrate, wherein the substrate comprises exposed electrical contacts electrically coupled to the electrical contacts on the surface of the die, wherein the orientation defines a first space in the cavity adjacent to a first edge of an upper surface of the die and a second space in the cavity adjacent to the second edge of the upper surface of the die; and
   an under-fill layer in the cavity between a lower surface of the die and the substrate; and
   wherein the exposed electrical contacts comprise substrate bonding pads and the electrical contacts on the surface of the die comprise die bonding pads, and wherein each die bonding pad is coupled to at least one substrate bonding pad with a wire, forming wire-bonded connections.

9. The apparatus of claim 8, further comprising fluidics fan-out regions comprising a first cured material deposited in the first space and the second space, a surface of the fluidics fan-out regions being contiguous with the upper surface of the die.

10. The apparatus of claim 9, further comprising:
    a fluidic flow channel over an active surface of the die defined by the surface of the fluidics fan-out regions and the upper surface of the die and a lid attached to portions of the substrate adjacent to the fluidics fan-out regions.

11. The apparatus of claim 8, wherein the wire-bonded connections are encapsulated in a second cured material.

12. The apparatus of claim 11, further comprising:
    a fluidic flow channel over an active surface of the die defined by the surface of the fluidics fan-out regions and the upper surface of the die and a lid attached to portions of the substrate adjacent to the fluidics fan-out regions, wherein the lid is oriented to be in physical contact with a top surface of each of the encapsulated wire-bonded connections.

13. The apparatus of claim 11, wherein each of the first cured material and the second cured material is selected from the group consisting of: epoxy and glue.

14. An apparatus of claim 8, the die further comprising a silicon wafer, a passivation stack, and one or more through silicon vias extended through a portion of the silicon wafer and the passivation stack, wherein the passivation stack is disposed below a lower surface of the portion of the silicon wafer, wherein a portion of each of the one or more through silicon vias is exposed through an opening of one or more openings in the passivation stack, and wherein each exposed portion is coupled to the electrical contacts.

15. The apparatus of claim 14, wherein the electrical contacts of the die comprise pillar bumps.

16. The apparatus of claim 8, wherein the die comprises a Complementary Metal-Oxide-Semiconductor (CMOS) detection device.

17. An apparatus comprising:
    a die, wherein one or more electrical contacts are accessible on a surface of the die;
    a substrate comprising a cavity, wherein the die is oriented in a portion of the cavity in the substrate, wherein the substrate comprises exposed electrical contacts electrically coupled to the electrical contacts on the surface of the die, wherein the orientation defines a first space in the cavity adjacent to a first edge of an upper surface of the die and a second space in the cavity adjacent to the second edge of the upper surface of the die; and an under-fill layer in the cavity between a lower surface of the die and the substrate;

the die further comprising a silicon wafer, a passivation stack, and one or more through silicon vias extended through a portion of the silicon wafer and the passivation stack, wherein the passivation stack is disposed below a lower surface of the portion of the silicon wafer, wherein a portion of each of the one or more through silicon vias is exposed through an opening of one or more openings in the passivation stack, and wherein each exposed portion is coupled to the electrical contacts.

18. The apparatus of claim 17, wherein the die comprises a Complementary Metal-Oxide-Semiconductor (CMOS) detection device.

19. The apparatus of claim 17, further comprising fluidics fan-out regions comprising a first cured material deposited in the first space and the second space, a surface of the fluidics fan-out regions being contiguous with the upper surface of the die.

20. The apparatus of claim 19, further comprising:

a fluidic flow channel over an active surface of the die defined by the surface of the fluidics fan-out regions and the upper surface of the die and a lid attached to portions of the substrate adjacent to the fluidics fan-out regions.

* * * * *